(12) United States Patent
Sugimoto

(10) Patent No.: US 10,268,091 B2
(45) Date of Patent: Apr. 23, 2019

(54) ELECTRO-OPTICAL DEVICE, METHOD OF MANUFACTURING ELECTRO-OPTICAL DEVICE, AND ELECTRONIC APPARATUS

(71) Applicant: SEIKO EPSON CORPORATION, Tokyo (JP)

(72) Inventor: Yohei Sugimoto, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/863,219

(22) Filed: Jan. 5, 2018

(65) Prior Publication Data

US 2018/0203314 A1    Jul. 19, 2018

(30) Foreign Application Priority Data

Jan. 16, 2017 (JP) ................. 2017-004880

(51) Int. Cl.
| | | |
|---|---|---|
| *H01L 27/12* | (2006.01) | |
| *G02F 1/1362* | (2006.01) | |
| *H01L 29/786* | (2006.01) | |
| *G02F 1/1368* | (2006.01) | |
| *H01L 49/02* | (2006.01) | |

(Continued)

(52) U.S. Cl.
CPC ...... *G02F 1/136213* (2013.01); *G02F 1/1368* (2013.01); *H01L 27/1222* (2013.01); *H01L 27/1255* (2013.01); *H01L 27/1259* (2013.01); *H01L 28/91* (2013.01); *H01L 29/78621* (2013.01); *H01L 29/78633* (2013.01); *H01L 29/78675* (2013.01); *G02F 1/1339* (2013.01);

(Continued)

(58) Field of Classification Search
CPC ............. H01L 27/1222; H01L 27/1255; H01L 27/1259; H01L 28/91; H01L 29/78621; H01L 29/78633; H01L 29/78675
See application file for complete search history.

(56) References Cited

U.S. PATENT DOCUMENTS

2004/0036051 A1* 2/2004 Sneh ................ H01L 27/10861
  251/301
2008/0048190 A1* 2/2008 Ishii .................. G02F 1/136209
  257/71

(Continued)

FOREIGN PATENT DOCUMENTS

| JP | 2000-171827 A | 6/2000 |
|---|---|---|
| JP | 2006-064967 A | 3/2006 |

(Continued)

*Primary Examiner* — Jaehwan Oh
(74) *Attorney, Agent, or Firm* — Oliff PLC

(57) ABSTRACT

A liquid crystal device as an electro-optical device includes a first insulating layer as a first layer with an insulating property stacked on a base member as a substrate, a trench provided in the first insulating layer for each pixel, a second insulating layer as a second layer stacked on the first insulating layer and having an aperture communicating with the trench, and a retention capacitor as a capacitance element including a first capacitance electrode, a first capacitance insulating film, and a second capacitance electrode which are provided on at least an inner side the trench and the aperture. A layer thickness of the first insulating layer is larger than a layer thickness of the second insulating layer, and a width of the trench is larger than a width of the aperture in the X direction as a first direction.

10 Claims, 17 Drawing Sheets

(51) Int. Cl.
 *G02F 1/1343* (2006.01)
 *G02F 1/1339* (2006.01)
 *G02F 1/1335* (2006.01)

(52) U.S. Cl.
 CPC .... *G02F 1/13439* (2013.01); *G02F 1/133512* (2013.01); *G02F 2201/121* (2013.01)

(56) References Cited

U.S. PATENT DOCUMENTS

| | | |
|---|---|---|
| 2016/0291434 A1 | 10/2016 | Sugimoto |
| 2016/0293644 A1* | 10/2016 | Sugimoto ......... H01L 29/78633 |
| 2017/0031221 A1 | 2/2017 | Sugimoto et al. |
| 2017/0102596 A1 | 4/2017 | Sugimoto |

FOREIGN PATENT DOCUMENTS

| | | |
|---|---|---|
| JP | 3197989 U | 6/2015 |
| JP | 3197990 U | 6/2015 |
| JP | 2015-197582 A | 11/2015 |
| JP | 2015-197583 A | 11/2015 |
| JP | 2015-197584 A | 11/2015 |
| JP | 2017-072741 A | 4/2017 |

* cited by examiner

ELECTRO-OPTICAL DEVICE, METHOD OF MANUFACTURING ELECTRO-OPTICAL DEVICE, AND ELECTRONIC APPARATUS

BACKGROUND

1. Technical Field

The present invention relates to an electro-optical device, a method of manufacturing an electro-optical device, and an electronic apparatus including the electro-optical device.

2. Related Art

An active drive type liquid crystal display device including a transistor which controls switching of a pixel electrode for each pixel is known as an electro-optical device. The liquid crystal display device includes a capacitance element for holding a potential written in a pixel in response to an image signal for each pixel.

For example, JP-A-2000-171827 discloses a liquid crystal display panel in which a trench is provided on an upper surface of a substrate and at least a part of an auxiliary capacitance electrode, an insulating film, and a pixel electrode is provided in the trench, as an electro-optical device including the capacitance element. According to JP-A-2000-171827, an auxiliary capacitor is formed by overlapping the auxiliary capacitance electrode with the pixel electrode through an insulating film in the trench. Thus, even if the planar size of the auxiliary capacitance electrode is relatively reduced, the degree of overlap between the auxiliary capacitance electrode and the pixel electrode can increase, and thereby, a desired electric capacitance of the auxiliary capacitor can be obtained and an aperture ratio of the pixel can increase.

In addition, for example, JP-A-2006-064967 discloses a capacitance display device including an active matrix substrate which includes a substrate in which a capacitor forming portion having a concave portion or a convex portion is formed on a surface; a switching element having a gate insulating layer; and a capacitance element which is provided on the capacitor forming portion and has a dielectric layer, and in which a gate insulating layer is formed of the same film as the dielectric layer and a layer thickness of the thinnest portion of the dielectric layer is smaller than a layer thickness of the gate insulating layer. According to JP-A-2006-064967, it is possible to realize a desired electrostatic capacitance value by a capacitance element having a small occupation area while securing a layer thickness of the gate insulating layer relating to a breakdown voltage of the switching element.

However, if the number of pixels is increased and a size of the pixel is reduced so as to realize high-definition display, the trench of JP-A-2000-171827 or a region in which the capacitor forming portion such as the concave portion or the convex portion of JP-A-2006-064967 can be provided is also reduced. By doing so, electric capacitance of the capacitance element is reduced, and thereby, a potential written in the pixel is hard to be sufficiently held, and there is a possibility that defects such as display unevenness may be generated. In other words, there is a problem that realization of a capacitance element capable of securing a desired electric capacitance with a smaller occupation area is required.

SUMMARY

An advantage of some aspects of the invention is that the invention can be realized by the following aspects or application examples.

Application Example

According to this application example, there is provided an electro-optical device including a substrate; a first layer with an insulating property that is stacked on the substrate; a trench that is provided in the first layer for each pixel; a second layer which is stacked on the first layer and in which an aperture that connect with the trench is provided; and a capacitance element that includes a first capacitance electrode, a first capacitance insulating film, and a second capacitance electrode which are provided on at least an inner side of the trench and the aperture. A layer thickness of the first layer is larger than a layer thickness of the second layer. A width of the trench is larger than a width of the aperture in a first direction parallel to the substrate.

According to this application example, a second layer stacked on a first layer with an insulating property is in a state of protruding like an eave on an inner side of a trench. Thus, as compared with a case where a capacitance element is simply provided in the trench, a first capacitance electrode, a first capacitance insulating film, and a second capacitance electrode are also provided on a surface of the second layer protruding from the trench, and thereby, it is possible to increase a substantial electric capacitance of the capacitance element. In other words, it is possible to provide an electro-optical device which includes a capacitance element having a larger electric capacitance than before and can realize excellent display quality, even if a pixel size in a planar view is reduced to achieve high definition.

In the electro-optical device according to the application example, it is preferable that a conductive layer in contact with the first capacitance electrode be provided between the substrate and the first layer.

In the configuration, a conductive layer can be used as a wire for a first capacitance electrode provided on an inner side of the trench, and thereby, it is possible to simplify a wiring structure.

In the electro-optical device according to the application example, it is preferable that the capacitance element include the first capacitance electrode, the first capacitance insulating film, the second capacitance electrode, the second capacitance insulating film, and a third capacitance electrode which are provided on at least an inner side of the trench and the aperture.

In the configuration, it is possible to further increase an electric capacitance of a capacitance element.

In the electro-optical device according to the application example, it is preferable that at least one of the first capacitance insulating film and the second capacitance insulating film be a high dielectric constant film.

In the configuration, it is possible to increase an electric capacitance of a capacitance element more than before.

In the electro-optical device according to the application example, it is preferable that a transistor which is provided for each pixel be provided between the substrate and the capacitance element and that the trench overlap a semiconductor layer of the transistor in a planar view.

According to the configuration, it is possible to provide an electro-optical device in which light incident on a semiconductor layer of a transistor is shielded by a capacitance element and generation of a light leakage current in a transistor is suppressed and a stable operation state is obtained.

Application Example

According to this application example, there is provided a method of manufacturing an electro-optical device including forming a second layer that is stacked on a first layer with an insulating property, has more excellent etching resistance than the first layer, and has a smaller layer thickness than the first layer, on a substrate; forming a trench that extends over the first layer and the second layer for each pixel by using an anisotropic etching; expanding the trench by performing isotropic etching of a part where the first layer in the trench is exposed; forming a first capacitance electrode by forming a first conductive film that covers an inner wall of the expanded trench and a surface of the second layer and patterning the first conductive film; forming a first capacitance insulating film that covers the first capacitance electrode; and forming a second capacitance electrode by forming a second conductive film that covers the first capacitance insulating film and patterning the second conductive film.

According to this application example, if a trench is expanded, a second layer stacked on a first layer with an insulating property protrudes like an eave on an inner side of the trench. Thus, a first capacitance electrode, a first capacitance insulating film, and a second capacitance electrode are sequentially formed on a surface of the second layer protruding on an inner side of the trench. Thus, it is possible to manufacture an electro-optical device including a capacitance element having a larger electric capacitance as compared with a case where a capacitance element is simply formed on an inner side of the trench.

In the method according to the application example, forming a conductive layer between the substrate and the first layer may be provided, and the trench that extends over the first layer and the second layer may be formed so as to reach the conductive layer.

Accordingly, a first capacitance electrode is formed so as to be in contact with a conductive layer on an inner side of a trench, and thereby, it is possible to manufacture an electro-optical device having a capacitance element in which a wiring structure is simplified by using a conductive layer as a wire of the first capacitance electrode.

In the method according to the application example, it is preferable to further include forming a second capacitance insulating film that covers the second capacitance electrode, and forming a third capacitance electrode by forming a third conductive film that covers the second capacitance insulating film and patterning the third conductive film.

Accordingly, it is possible to form a capacitance element having a larger electric capacitance.

In the method according to the application example, it is preferable that at least one of the first capacitance insulating film and the second capacitance insulating film be formed by using a high dielectric constant film.

Accordingly, it is possible to form a capacitance element having a larger electric capacitance.

Application Example

According to this application example, there is provided an electronic apparatus including the electro-optical device described in the above-described application examples.

According to this application, an electro-optical device includes a capacitance element having a desired electric capacitance capable of holding a potential based on an image signal applied to a pixel, and thus, it is possible to provide an electronic apparatus that has excellent display quality and can perform good-looking display.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments that specify the invention will be described with reference to the accompanying drawings. The drawings which are used are illustrated in an appropriately expanded or contracted manner, such that portions to be described are in a recognizable state.

In the present embodiment, an active drive type liquid crystal device that includes a thin film transistor (referred to as TFT) for each pixel as an electro-optical device will be described as an example. The liquid crystal device can be appropriately used, for example, as optical modulation means (liquid crystal light valve) of a projection type display device (liquid crystal projector) to be described below.

First Embodiment

Electro-Optical Device

Figure 1:
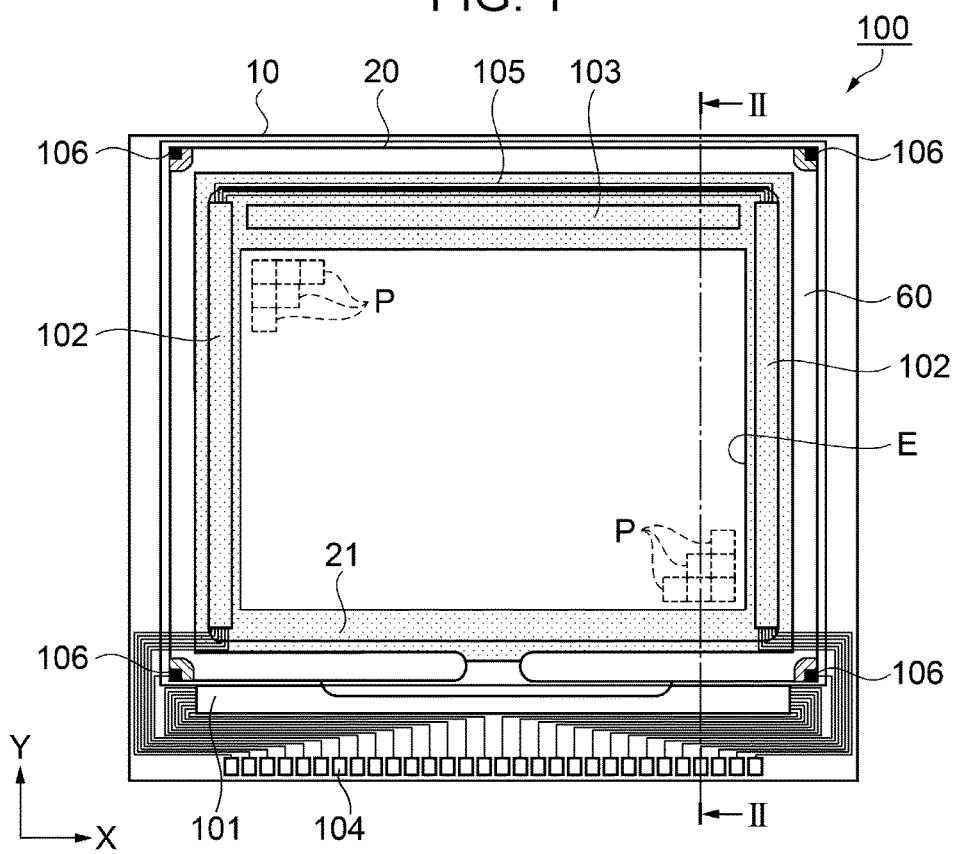
FIG. 1 is a schematic plan view illustrating a configuration of a liquid crystal device according to a first embodiment.
Figure 2:
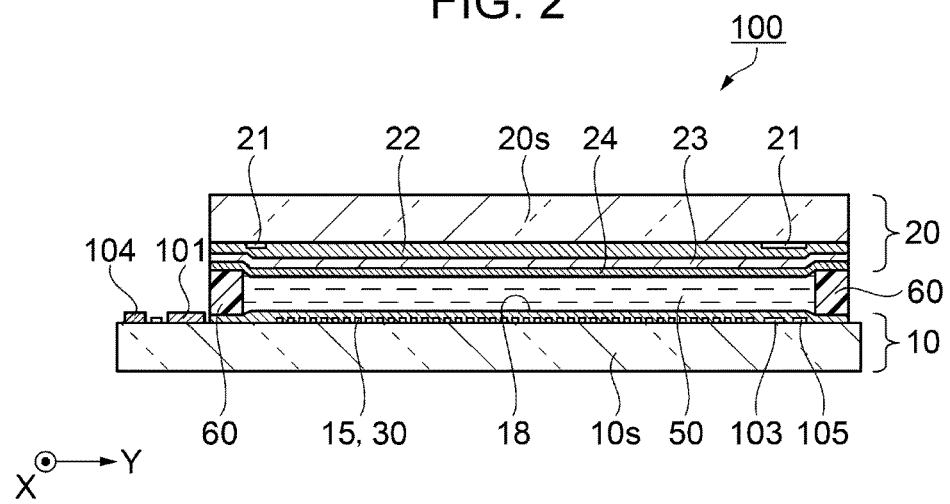
FIG. 2 is a schematic cross-sectional view taken along a line II-II of the liquid crystal device illustrated in FIG. 1.
Figure 3:
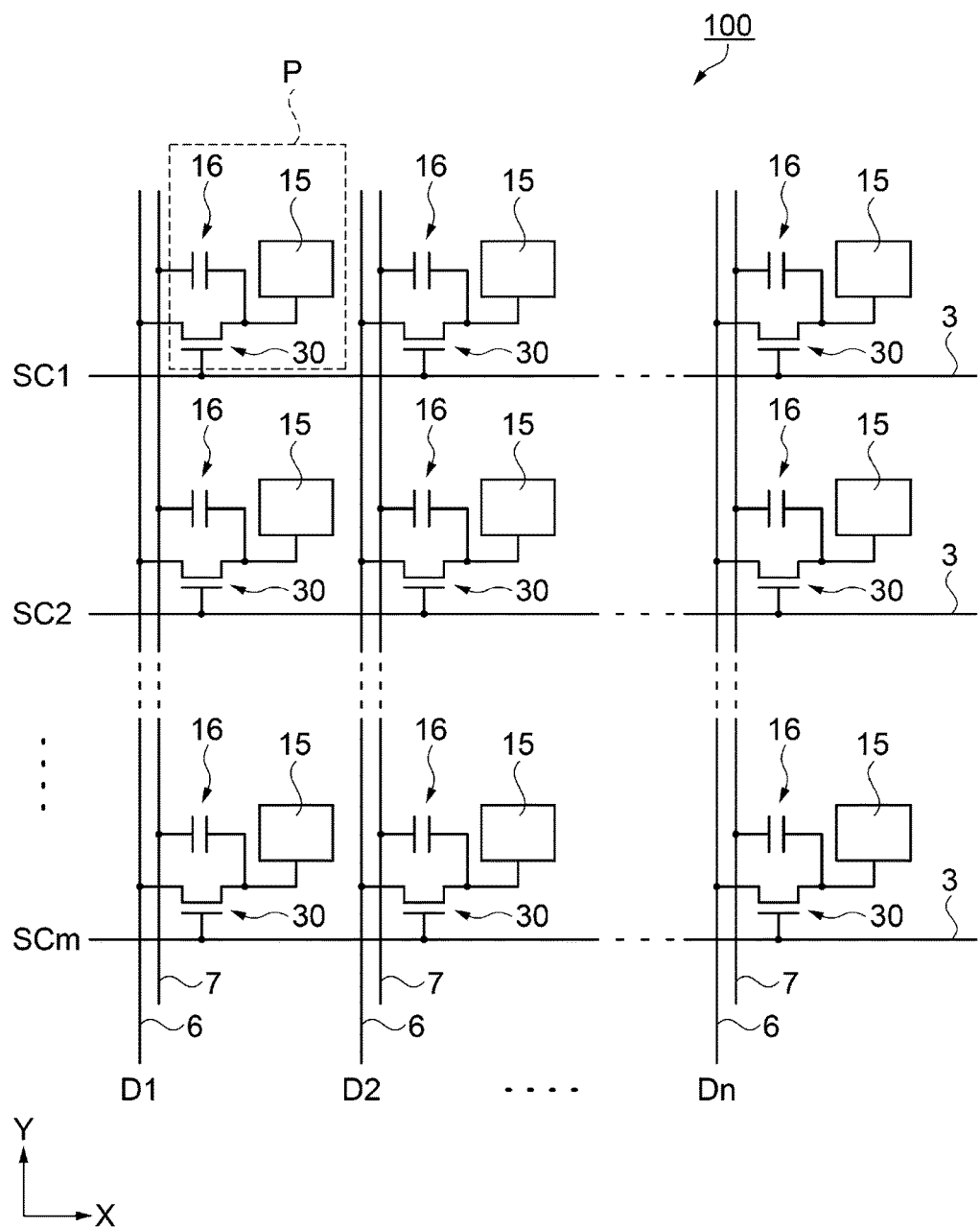
FIG. 3 is an equivalent circuit diagram illustrating an electrical configuration of the liquid crystal device.

To begin with, a configuration of a liquid crystal device that is used as an electro-optical device according to the present embodiment will be described with reference to FIG. 1 to FIG. 3. FIG. 1 is a schematic plan view illustrating a configuration of the liquid crystal device. FIG. 2 is a schematic sectional view taken along the line II-II of the liquid crystal device illustrated in FIG. 1, and FIG. 3 is an equivalent circuit diagram illustrating an electrical configuration of the liquid crystal device.

As illustrated in FIG. 1 and FIG. 2, a liquid crystal device 100 according to the present embodiment includes an element substrate 10 and a counter substrate 20 that are disposed to face each other, and a liquid crystal layer 50 that is interposed between a pair of the substrates. A base member 10s of the element substrate 10 and a base member 20s of the counter substrate 20 use a light-transmittance material, such as a quartz substrate or a glass substrate. In the present specification, light transmittance means a property of capable of transmitting at least 85% or more of light in a visible light wavelength region. In addition, a light shielding property in the present specification means a property of shielding at least 95% or more of the light in the visible light wavelength region.

The element substrate 10 is slightly larger than the counter substrate 20. The element substrate 10 and the counter substrate 20 are bonded together through a sealing material 60 that is disposed in a frame shape along an outer edge of the counter substrate 20, and a liquid crystal layer 50 is configured by sealing liquid crystal having a positive or negative dielectric anisotropy in an interval therebetween. An adhesive such as a heat-curable or ultraviolet curable epoxy resin is employed in the sealing material 60. A spacer (not illustrated) for constantly maintaining the interval between a pair of substrates is mixed into the sealing material 60.

A display region E in which a plurality of pixels P are arranged in a matrix is provided on an inner side of the sealing material 60. In addition, in the counter substrate 20, a parting section 21 that surrounds the display region E is provided between the sealing material 60 and the display region E. The parting section 21 is configured with, for example, a metal with a light shielding property, a metal oxide, or the like. The display region E may include dummy pixels that are disposed to surround the plurality of pixels P, in addition to the plurality of pixels P contributing to displaying.

A terminal section in which a plurality of external connection terminals 104 are arranged is provided in the element substrate 10. A data line drive circuit 101 is provided between a first side portion along the terminal section of the element substrate 10 and the sealing material 60. In addition, a test circuit 103 is provided between the sealing material 60 along a second side portion facing the first side portion and the display region E. Furthermore, scan line drive circuits 102 are provided between the sealing material 60 along third and fourth side portions that are orthogonal to the first side portion and face each other and display region E. A plurality of wires 105 which connect the two scan line drive circuits 102 together are provided between the sealing material 60 of the second side portion and the test circuit 103.

The wires that are connected to the data line drive circuit 101 and the scan line drive circuit 102 are connected to a plurality of external connection terminals 104 that are arranged along the first side portion. Thereafter, it will be described that a direction along the first side portion is referred to as an X direction, and a direction along the third side portion and the fourth side portion is referred to as a Y direction. In the present specification, a direction orthogonal to the X direction and the Y direction, and a normal direction of the counter substrate 20 are referred to as a "planar view" or "planar".

As illustrated in FIG. 2, the element substrate 10 includes the base member 10s, TFTs 30 or pixel electrodes 15 that are formed on a surface of the base member 10s on a liquid crystal layer 50 side, and an alignment film 18 that covers the pixel electrodes 15. The TFT 30 and the pixel electrode 15 are configuration elements of the pixel P. The pixel P will be described in detail below.

The counter substrate 20 includes the base member 20s, the parting sections 21 that are sequentially stacked on a surface of the base member 20s on the liquid crystal layer 50 side, a planarization layer 22, a common electrode 23, an alignment film 24, and the like.

As illustrated in FIG. 1, the parting sections 21 surround the display region E, and are provided in positions that respectively overlap the scan line drive circuit 102 and the test circuit 103 in a planar manner. Thereby, the parting section performs a function of shielding light incident on the peripheral circuit including the drive circuits from the counter substrate 20 side and preventing the peripheral circuit from malfunctioning due to the light. In addition, light is shielded such that unnecessary stray light is not incident on the display region E, and thus, it is possible to secure high contrast for displaying on the display region E.

The planarization layer 22 with light transmittance is formed of, for example, an inorganic material such as a silicon oxide, and is provided to cover the parting sections 21. The planarization layer 22 is a silicon oxide film which is formed by using, for example, a plasma CVD method or the like, and has a layer thickness to the extent that roughness of a surface of the common electrode 23 which is formed on the planarization layer 22 can be reduced.

The common electrode 23 is formed of a transparent conductive film such as an indium tin oxide (ITO) or an indium zinc oxide (IZO), covers the planarization layer 22, and is electrically connected to wires on the element substrate 10 side by vertical connection sections 106 that are provided on four corners of the counter substrate 20, as illustrated in FIG. 1.

The alignment film 18 that covers the pixel electrodes 15 and the alignment film 24 that covers the common electrode 23 are set based on an optical design of the liquid crystal device 100, and employs an oblique deposition film (inorganic alignment film) of an inorganic material such as a silicon oxide. The alignment films 18 and 24 may employ an organic alignment film such as polyimide, in addition to the inorganic alignment film.

The liquid crystal device 100 is a transmission type, and employs an optical design of a normally white mode in which display is bright when the pixel P is not driven or a normally black mode in which display is dark when the pixel is not driven. Polarization elements are respectively disposed on an incident side and an exit side of light, according to an optical design.

Next, an electrical configuration of the liquid crystal device 100 will be described with reference to FIG. 3. The liquid crystal device 100 includes a plurality of scan lines 3 and a plurality of data lines 6 that are used as signal wires which are insulated with each other and orthogonal to each other in at least the display region E, and capacitance lines 7.

The pixel electrode 15, the TFT 30, and a retention capacitor 16 are provided in a region that is separated by the scan line 3 and the data line 6, and a pixel circuit of the pixel P is configured by those.

The scan line 3 is electrically connected to a gate of the TFT 30, the data line 6 is electrically connected to a source of the TFT 30, and the pixel electrode 15 is electrically connected to a drain of the TFT 30.

The data line 6 is connected to the data line drive circuit 101 (refer to FIG. 1). Image signals D1, D2, . . . , Dn are supplied to the respective pixels P from the data line drive circuit 101 through the data lines 6. The scan line 3 is connected to the scan line drive circuit 102 (refer to FIG. 1). Scan signals SC1, SC2, . . . , SCm are supplied to the respective pixels P from the scan line drive circuit 102 through the scan lines 3.

The image signals D1 to Dn which are supplied from the data line drive circuit 101 may be supplied to the data lines 6 in an ascending order of lines, and may be supplied to each group of a plurality of data lines 6 adjacent to each other. The scan line drive circuit 102 supplies the scan signals SC1 to SCm to the scan lines 3 in an ascending order of lines in a pulse manner at a predetermined timing.

The liquid crystal device 100 has a configuration in which the TFT 30 that is a switching element is in an ON state only for a predetermined period by inputting of the scan signals SC1 to SCm and thereby the image signals D1 to Dn that are supplied from the data lines 6 are written to the pixel electrodes 15 at a predetermined timing. The image signals D1 to Dn with predetermined levels that are written to the liquid crystal layer 50 through the pixel electrodes 15 are retained for a predetermined period between the common electrodes 23 and the pixel electrodes 15.

In order to prevent the retained image signals D1 to Dn from leaking, the retention capacitor 16 as a capacitance element is connected in parallel to a liquid crystal capacitor formed between the pixel electrode 15 and the common electrode 23. The retention capacitor 16 is provided between the drain of the TFT 30 and a capacitance line 7.

The data lines 6 are connected to the test circuit 103 illustrated in FIG. 1, and the test circuit 103 is configured such that operation defects or the like of the liquid crystal device 100 can be confirmed by detecting the image signals during manufacturing of the liquid crystal device 100, but this is omitted in the equivalent circuit of FIG. 3.

In addition, the test circuit 103 may include a sampling circuit that samples the image signals and supplies the sampled image signals to the data lines 6, and a precharge circuit which supplies precharge signals with a predetermined voltage level to the data lines 6 prior to the image signals.

Figure 4:
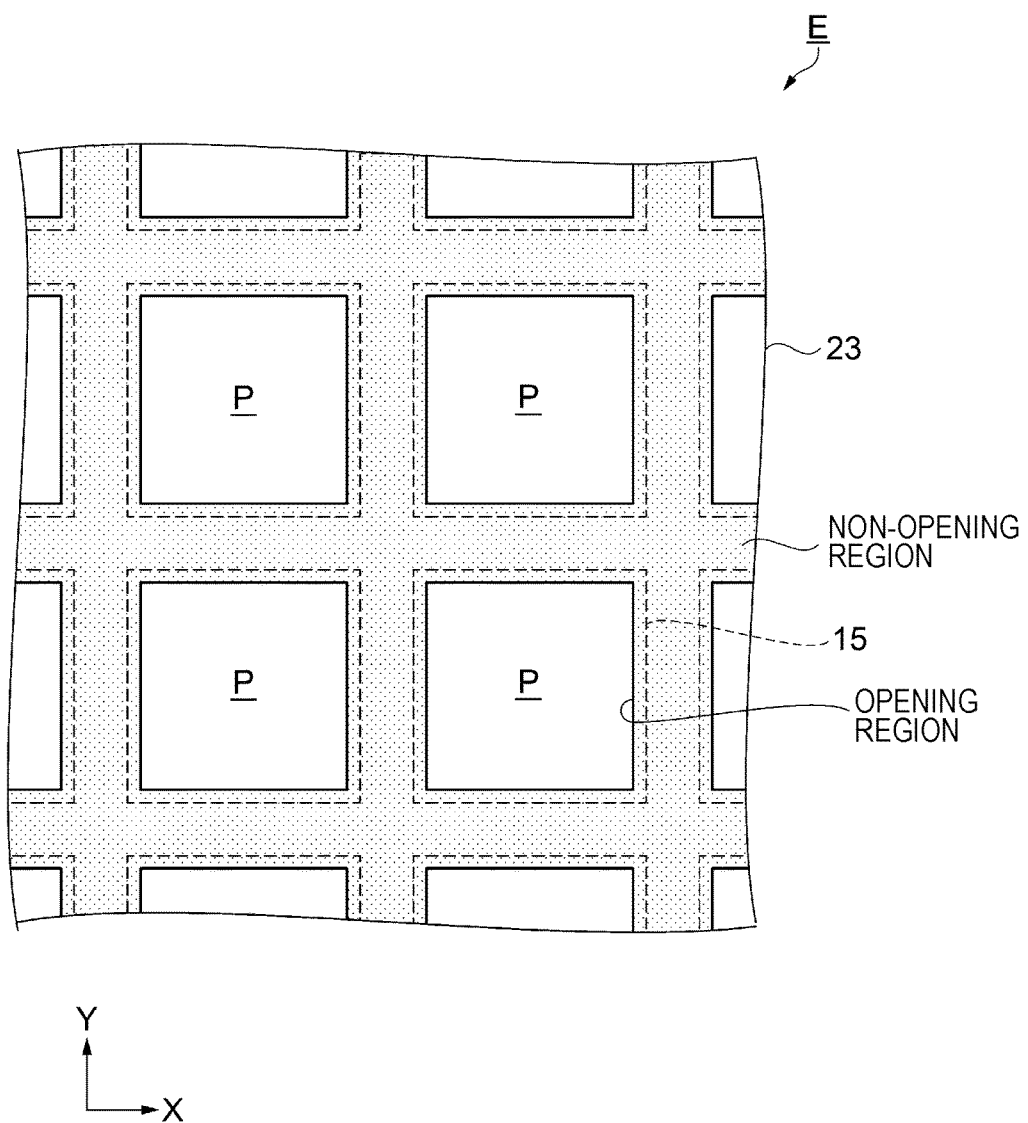
FIG. 4 is a schematic plan view illustrating arrangement of pixels.

Next, a configuration of the pixel P in the liquid crystal device 100 will be described with reference to FIG. 4. FIG. 4 is a schematic plan view illustrating disposition of the pixels.

As illustrated in FIG. 4, the pixel P in the liquid crystal device 100 has, for example, an approximately rectangular (approximately square) aperture region in a planar view. The aperture region is surrounded by a non-aperture region with a light shielding property that extends in the X and Y directions and is provided in a lattice pattern.

The scan line 3 illustrated in FIG. 3 is provided in the non-aperture region which extends in the X direction. The scan line 3 uses a conductive member with a light shielding property, and a part of the non-aperture region is configured by the scan line 3.

In the same manner, the data line 6 illustrated in FIG. 3 and the capacitance line 7 are provided in the non-aperture region which extends in the Y direction. The data line 6 and the capacitance line 7 also use a conductive member with a light shielding property, and a part of the non-aperture region is configured by the data line and the capacitance line.

The TFT 30 and the retention capacitor 16 which are illustrated in FIG. 3 are provided near an intersection of the non-aperture regions. By providing the TFT 30 and the retention capacitor 16 near the intersection of the non-aperture region with a light shielding property, a light leakage current of the TFT 30 is prevented from being generated and an aperture ratio of the aperture region is secured.

The pixel electrode 15 is provided in each pixel P. The pixel electrode 15 is approximately a square in a planar view, and is provided in the aperture region such that an outer edge of the pixel electrode 15 overlaps the non-aperture region.

The liquid crystal device 100 according to the present embodiment is a transmission type, and the element substrate 10 adopts a light shielding structure which prevents light incident on the pixel P from being incident on the TFT 30, on the premise that light is incident from the counter substrate 20 side. In addition, a configuration is provided in which, while securing the aperture ratio in the aperture region, a desired electric capacitance can be secured in the retention capacitor 16 provided in the non-aperture region, even if a width of the non-aperture region is narrowed.

Since the liquid crystal device 100 according to the present embodiment is used as light modulation means (liquid crystal light valve) of a projection type display device (liquid crystal projector) which will be described below, in a case where disposition pitches of the pixel P in the X direction and the Y direction are less than or equal to 5 widths of the non-aperture region in the X direction and the Y direction are set to be larger than or equal to 1 μm and less than 1.5 μm from the viewpoint of securing an aperture ratio of 50% or more in the aperture region where the pixel electrode 15 is disposed.

TFT and Retention Capacitor

Figure 5:
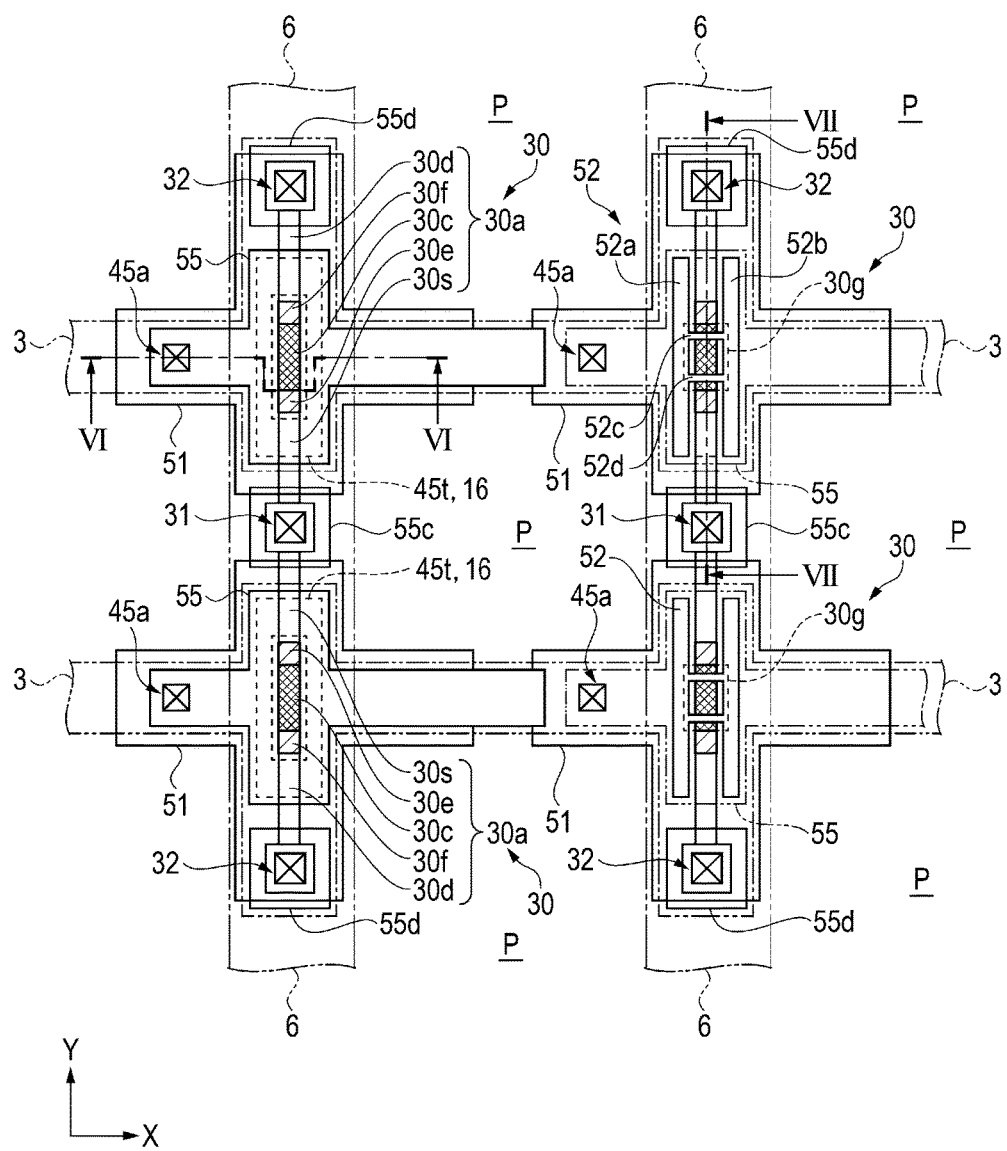
FIG. 5 is a schematic plan view illustrating arrangement of TFTs and retention capacitors on an element substrate.

Next, configurations of the TFT 30 and the retention capacitor 16 in the element substrate 10 will be described with reference to FIGS. 5 to 7. FIG. 5 is a schematic plan view illustrating arrangement of the TFTs and the retention capacitor in the element substrate.

As illustrated in FIG. 5, the TFT 30 is provided for each pixel P corresponding to an intersection between the scan line 3 extending in the X direction and the data line 6 extending in the Y direction. The TFT 30 includes a semiconductor layer 30a formed of, for example, high-temperature polysilicon, and the semiconductor layer 30a is disposed along the data line 6 at the intersection. The semiconductor layer 30a is configured by a lightly doped drain (LDD) structure having a first source and drain region 30s, a junction region 30e, a channel region 30c, a junction region 30f, and a second source and drain region 30d, into which impurity ions are injected with different concentrations.

In addition, in the present embodiment, the semiconductor layers 30a of the TFTs 30 in the pixels P adjacent in the Y direction s are in a state where the first source and drain regions 30s are connected to each other so as to share a contact hole 31 for electrically connecting the first source and drain region 30s to the data line 6. A contact hole 32 for electrically connecting the second source and drain regions 30d to the retention capacitor 16 and the pixel electrode 15 is provided at both end portions of the semiconductor layers in a state where the two semiconductor layers 30a are connected to each other. Specifically, the contact hole 31 is connected to a relay layer 55c for electrical connection to the data line 6. The contact hole 32 is connected to a relay layer 55d for electrical connection to the retention capacitor 16 and the pixel electrode 15.

A detailed structure of the element substrate 10 will be described below, and the semiconductor layer 30a is disposed between the first light shielding layer 51 and the scan line 3, on the base member 10s. The first light shielding layer 51 does not overlap the contact hole 31 in a planar view, but is formed in a substantially cross shape so as to overlap the intersection between the scan line 3 and the data line 6, and the contact hole 32. The scan line 3 has a portion protruding upward and downward in the Y direction along the data line 6 from the intersection. Thereby, the scan line 3 is in a state of overlapping the channel region 30c of the semiconductor layer 30a and the junction regions 30e and 30f, which interpose the channel region 30c therebetween, of the semiconductor layer 30a, a part of the first source and drain region 30s, and the second source and drain region 30d in a planar view.

In addition, a conductive layer 55 of a substantially cross shape is disposed in the intersection between the scan line 3 and the data line 6 so as to overlap the scan line 3 in a planar view. The conductive layer 55 also overlaps the portion of the scan line 3 that protrudes upward and downward in the Y direction along the data line 6 from the intersection. The relay layer 55c for electrically connecting the first source and drain region 30s to the data line 6, and the relay layer 55d for electrically connecting the second source and drain region 30d to the retention capacitor 16 and the pixel electrode 15 are independently formed in an island shape, in the same layer as the conductive layer 55.

A gate electrode 30g is provided in an island shape at a location where the gate electrode overlaps the channel region 30c in the semiconductor layer 30a of the TFT 30 in a planar view. In addition, a second light shielding layer 52 is provided between the gate electrode 30g and the scan line 3, on the base member 10s. Since the second light shielding layer 52 is located under the conductive layer 55 and the scan line 3, the semiconductor layer 30a located on the left side of the pixel P is illustrated such that the disposition of the conductive layer 55 can be seen, and the semiconductor layer 30a located on the right side of the pixel P is illustrated such that a planar shape and disposition of the second light shielding layer 52 can be seen through the conductive layer 55 and the scan line 3, in the X direction in FIG. 5. According to this, the second light shielding layer 52 includes portions 52a and 52b extending in the Y direction with the semiconductor layer 30a interposed therebetween, and portions 52c and 52d which overlap the channel region 30c, extend in the X direction, and are separated from each other, in a planar view. Lengths of the portions 52a and 52b extending in the Y direction with the semiconductor layer 30a interposed therebetween is substantially the same as a length of the conductive layer 55 in the Y direction at the intersecting.

The retention capacitor 16 is provided in a trench (groove) 45t (an approximately rectangular shape denoted by a dashed line in FIG. 5) formed to overlap the second light shielding layer 52 above the conductive layer 55 in a planar view.

Next, a structure of the element substrate 10 will be described with reference to FIGS. 6 and 7. FIG. 6 is a schematic cross-sectional view illustrating the structure of the element substrate taken along a line VI-VI in FIG. 5, and FIG. 7 is a schematic cross-sectional view illustrating the structure of the element substrate taken along a line VII-VII in FIG. 5. In FIG. 5, the line VI-VI is a line segment passing through a contact hole 45a above the conductive layer 55 and a boundary between the channel region 30c and the junction region 30e of the semiconductor layer 30a in the X direction in a planar view. In FIG. 5, the line VII-VII is a line segment passing through the semiconductor layer 30a from the contact hole 31 to the contact hole 32 in the Y direction in a planar view.

Figure 6:
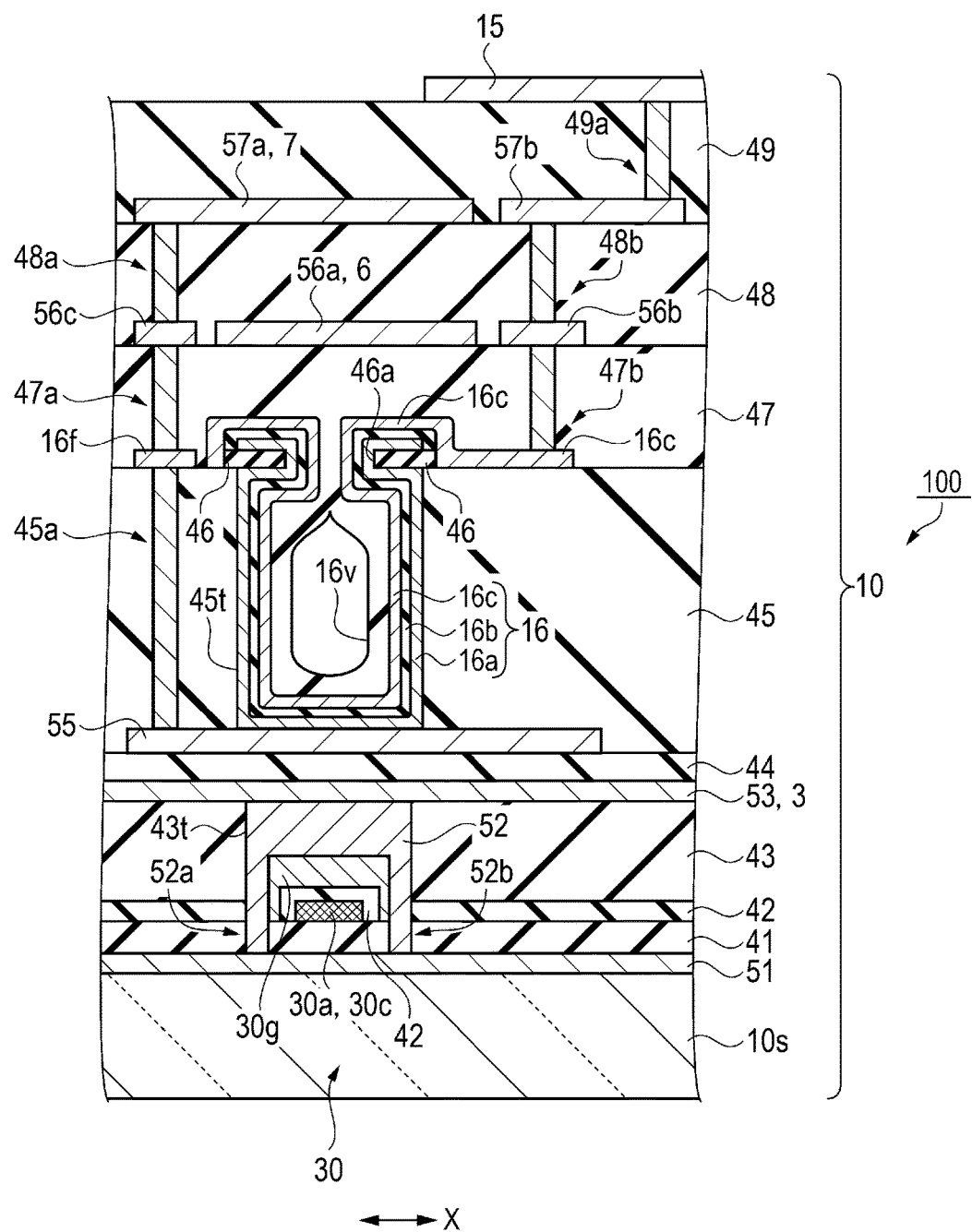
FIG. 6 is a schematic cross-sectional view illustrating a structure of the element substrate taken along a line VI-VI of FIG. 5.

As illustrated in FIG. 6, the first light shielding layer 51 is first formed on the base member 10s. The first light shielding layer 51 is configured by, for example, a light shielding conductive film. The conductive film with a light shielding property may be formed by using a single metal whose physical property is hard to be changed even at high temperature and which contains at least one of metals such as titanium (Ti), chromium (Cr), tungsten (W), tantalum (Ta), and molybdenum (Mo), an alloy, metal silicide, polysilicide, nitride, or a material in which those are stacked, by considering formation of the semiconductor layer 30a which will be described below at a high temperature (approximately 1,000° C.). In the present embodiment, tungsten silicide (W—Si) is used.

A first insulating film 41 formed of, for example, silicon oxide ($SiO_2$) is formed so as to cover the first light shielding layer 51. Then, the semiconductor layer 30a is formed on the first insulating film 41. As described above, the semiconductor layer 30a is formed of, for example, high-temperature polysilicon (Poly-Si) and has an LDD structure. The second insulating film 42 is formed so as to cover the semiconductor layer 30a and the first insulating film 41. The second insulating film 42 functions as a gate insulating film and is formed of a high dielectric constant film, for example, silicon oxide ($SiO_2$), aluminum oxide ($Al_2O_3$) with a higher dielectric constant than silicon oxide, hafnium oxide ($HfO_2$), zirconium oxide ($ZrO_2$) or the like.

The gate electrode 30g configured by, for example, conductive polysilicon is formed on the second insulating film 42 which covers the semiconductor layer 30a. As illustrated in FIG. 5, the gate electrode 30g is formed to overlap the channel region 30c of the semiconductor layer 30a in a planar view. A first interlayer insulating film 43 configured by, for example, silicon oxide is formed to cover the gate electrode 30g and the second insulating film 42. The first interlayer insulating film 43 covers the gate electrode 30g and thereby unevenness is generated on a surface thereof, planarization processing such as CMP processing is performed to eliminate the unevenness. The groove 43t is formed which reaches the first light shielding layer 51 by passing through a part of the first interlayer insulating film 43, the second insulating film 42, and the first insulating film 41 that overlap the gate electrode 30g in a planar view, and by passing through portions interposing the gate electrode 30g therebetween in the X direction. A conductive film with a light shielding property which covers the first interlayer insulating film 43 is formed to fill the groove 43t. The second light shielding layer 52 is formed by patterning the conductive film. The second light shielding layer 52 is also formed by using the conductive film with a light shielding property in the same manner as the above-described first light shielding layer 51.

A conductive film for low resistance wiring such as Aluminum (Al), titanium (Ti), an alloy of these metals, or nitride, is formed on the first interlayer insulating film 43 so as to be in contact with the second light shielding layer 52, and a third light shielding layer 53 functioning as the scan line 3 is formed by patterning the conductive film.

The second interlayer insulating film 44 configured by, for example, silicon oxide is formed to cover the third light shielding layer 53. A conductive film for low resistance wiring is formed to cover the second interlayer insulating film 44, and the conductive film is patterned, and the conductive layer 55 is formed at a position overlapping the semiconductor layer 30a of the TFT 30 in a planar view.

A first insulating layer 45 configured by, for example, silicon oxide is formed as a first layer with an insulating property which covers the conductive layer 55. The trench 45t which overlaps the semiconductor layer 30a of the TFT 30 in a planar view and reaches the conductive layer 55 is formed in the first insulating layer 45. In addition, a through hole which reaches the conductive layer 55 is formed in the first insulating layer 45 separately from the trench 45t, a conductive film filling the through hole is formed, and the contact hole 45a connected to the conductive layer 55 is formed.

A second insulating layer 46 as a second layer which is stacked on the first insulating layer 45 and protrudes like an eave on an inner side of the trench 45t is formed. An aperture 46a is defined by the second insulating layer 46. The trench 45t provided in the first insulating layer 45 and an aperture 46a of the second insulating layer 46 configure a space whose cross section has a bottle shape, and the retention capacitor 16 as a capacitance element which includes the first capacitance electrode 16a, the first capacitance insulating film 16b, and a second capacitance electrode 16c is provided in the space of the bottle shape. The conductive layer 55 and a first capacitance electrode 16a are in contact with each other and are electrically connected to each other on a bottom surface of the trench 45t. Meanwhile, a second capacitance electrode 16c is patterned to extend to the outside more than a region where the trench 45t is formed. In addition, a relay layer 16f is formed in an island shape on the same layer as the second capacitance electrode 16c, and is electrically connected to the contact hole 45a. As described above, a configuration including the aperture 46a communicating with the trench 45t may be hereinafter referred to as a bottle shaped trench 45t.

A detailed method of forming the retention capacitor 16 will be described below, but the first capacitance electrode 16a, the first capacitance insulating film 16b, the second capacitance electrode 16c are formed in the bottle shaped trench 45t, a third interlayer insulating film 47 is formed, and thereby, the aperture 46a is closed by the third interlayer insulating film 47 and a void 16v may be generated in the inside thereof according to sizes of the bottle shaped trench 45t and the aperture 46a.

The third interlayer insulating film 47 configured by, for example, silicon oxide is formed to cover the retention capacitor 16 and the relay layer 16f. A through hole reaching the relay layer 16f and a through hole reaching the extracted second capacitance electrode 16c are formed in the third interlayer insulating film 47. In addition, a conductive film for low resistance wiring is formed on the third interlayer insulating film 47 so as to fill the through holes, and by patterning the conductive film, a wiring layer 56a functioning as the data line 6, a relay layer 56b connected to the second capacitance electrode 16c through a contact hole 47b, and a relay layer 56c connected to the relay layer 16f through the contact hole 47a are formed.

A fourth interlayer insulating film 48 configured by, for example, silicon oxide is formed to cover the wiring layer 56a and the relay layers 56b and 56c. A through hole reaching the relay layer 56c and a through hole reaching the relay layer 56b are formed in the fourth interlayer insulating film 48. In addition, a conductive film for low resistance wiring is formed on the fourth interlayer insulating film 48 so as to fill the through holes, and the conductive film is patterned and connected to the relay layer 56c through the contact hole 48a, and a wiring layer 57a functioning as the capacitance line 7 and a relay layer 57b connected to the relay layer 56b through a contact hole 48b are formed on the fourth interlayer insulating film 48.

A fifth interlayer insulating film 49 configured by, for example, silicon oxide is formed to cover the wiring layer 57a and the relay layer 57b. A through hole reaching the relay layer 57b is formed in the fifth interlayer insulating film 49. In addition, a transparent conductive film such as ITO or IZO is formed on the fifth interlayer insulating film 49 so as to fill the through hole, and the transparent conductive film is patterned to form the pixel electrode 15 connected to the relay layer 57b through the contact hole 49a for each pixel P.

That is, the first capacitance electrode 16a of the retention capacitor 16 formed in the bottle shaped trench 45t is electrically connected to the wiring layer 57a functioning as the capacitance line 7 through the conductive layer 55, the contact hole 45a, the relay layer 16f, the contact hole 47a, the relay layer 56c, and the contact hole 48a. In addition, the second capacitance electrode 16c of the retention capacitor 16 is electrically connected to the pixel electrode 15 through the contact hole 47b, the relay layer 56b, the contact hole 48b, the relay layer 57b, and the contact hole 49a.

Next, a configuration relating to the TFT 30 and the retention capacitor 16 which cannot be illustrated in FIG. 6 will be further described with reference to FIG. 7.

A base layer 41a is provided between an end portion of the first source and drain region 30s and an end portion of the second source and drain region 30d of the semiconductor layer 30a and the first insulating film 41. The base layer 41a is formed by using, for example, high-temperature polysilicon or the like. By forming the base layers 41a, the end portions of the first source and drain region 30s and the end portion of the second source and drain region 30d of the semiconductor layer 30a are raised, and when the contact holes 31 and 32 are formed, the end portions are etched and an electrical connection is prevented from being damaged.

The third light shielding layer 53 functioning as the scan line 3 formed on the first interlayer insulating film 43 is electrically connected to the gate electrode 30g by portions 52c and 52d of the second light shielding layer 52 provided between the third light shielding layer 53 and the gate electrode 30g.

The second interlayer insulating film 44 covering the third light shielding layer 53 is formed. A through hole passing through the second insulating film 42, the first interlayer insulating film 43, and the second interlayer insulating film 44 and reaching the first source and drain region 30s of the semiconductor layer 30a, and a through hole reaching the second source and drain region 30d of the same semiconductor layer 30a are formed. A conductive film for low resistance wiring is formed by covering the second interlayer insulating film 44 so as to fill the through holes. The conductive film is patterned to form the conductive layer 55, the contact hole 31, the relay layer 55c electrically connected to the first source and drain region 30s through the contact hole 31, the contact hole 32, and the relay layer 55d electrically connected to the second source and drain region 30d through the contact hole 32.

A contact hole 45b reaching the relay layer 55c and a contact hole 45c reaching the relay layer 55d are formed in the first insulating layer 45. In addition, a relay layer 16g is formed on the first insulating layer 45 in the same layer as the second capacitance electrode 16c, and the relay layer 16g is connected to the relay layer 55c of a lower layer through the contact hole 45b. In addition, the second capacitance electrode 16c extends to the outside from a region where the bottle shaped trench 45t is provided and is in contact with the contact hole 45c. That is, the second capacitance electrode 16c is electrically connected to the second source and drain region 30d of the semiconductor layer 30a through the contact hole 45c, the relay layer 55d, and the contact hole 32. As illustrated in FIG. 6, the second capacitance electrode 16c is also electrically connected to the pixel electrode 15. That is, the second capacitance electrode 16c is electrically connected to the second source and drain region 30d (drain of the TFT 30) of the semiconductor layer 30a and the pixel electrode 15.

The third interlayer insulating film 47 covering the retention capacitor 16 provided in the bottle shaped trench 45t and the relay layer 16g is formed. A through hole reaching the relay layer 16g is formed in the third interlayer insulating film 47, and a conductive film for low resistance wiring is formed on the third interlayer insulating film 47 so as to fill the through hole. The conductive film is patterned to form the wiring layer 56a functioning as the data line 6, and a contact hole 47c for electrically connecting the relay layer 16g to the wiring layer 56a.

The fourth interlayer insulating film 48 covering the wiring layer 56a is formed and the wiring layer 57a functioning as the capacitance line 7 is formed on the fourth interlayer insulating film 48. Furthermore, the fifth interlayer insulating film 49 covering the wiring layer 57a is formed.

Figure 7:
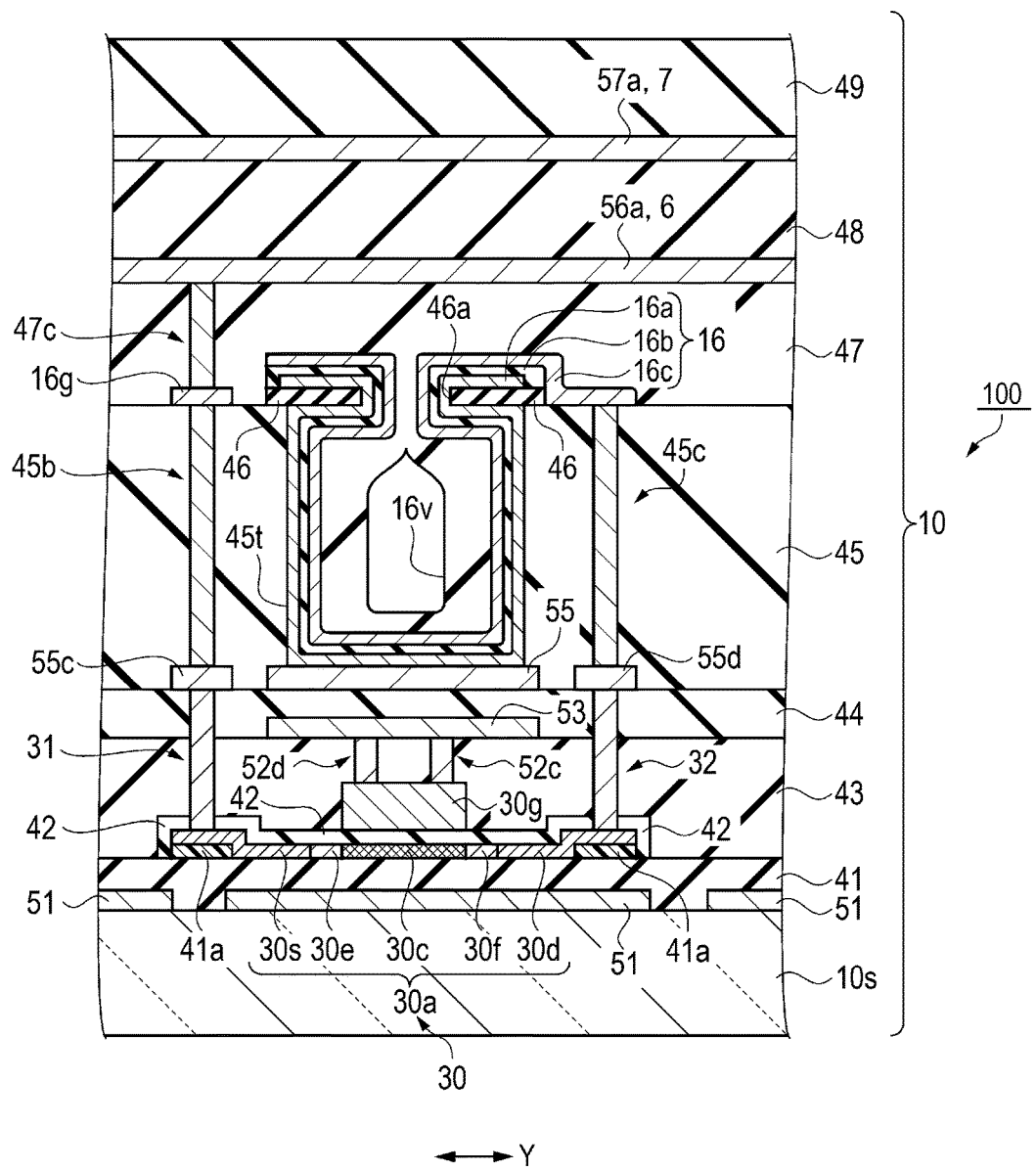
FIG. 7 is a schematic cross-sectional view illustrating a structure of the element substrate taken along a line VII-VII of FIG. 5.

As illustrated in FIGS. 6 and 7, the semiconductor layer 30a of the TFT 30 is disposed on the first light shielding layer 51, and the gate electrode 30g, the second light shielding layer 52, the third light shielding layer 53 (scan line 3), the conductive layer 55, and the retention capacitor 16 are arranged over the semiconductor layer 30a, in the base member 10s. Since the conductive layer 55 and the retention capacitor 16 also have a light shielding property, not only light incident from the base member 10s toward the TFT 30 but also light incident from the counter substrate 20 to the element substrate 10 through the liquid crystal layer 50 and travels toward the TFT 30 is shielded by the retention capacitor 16, the conductive layer 55, and the third light shielding layer 53. That is, since a structure is provided in which the light incident on the semiconductor layer 30a of the TFT 30 is shielded, a light leakage current hardly flows through the semiconductor layer 30a, and a stable operation is performed. The base member 10s is an example of a substrate on which the capacitance element according to the invention is provided.

Method of Manufacturing Electro-Optical Device

Figure 8:
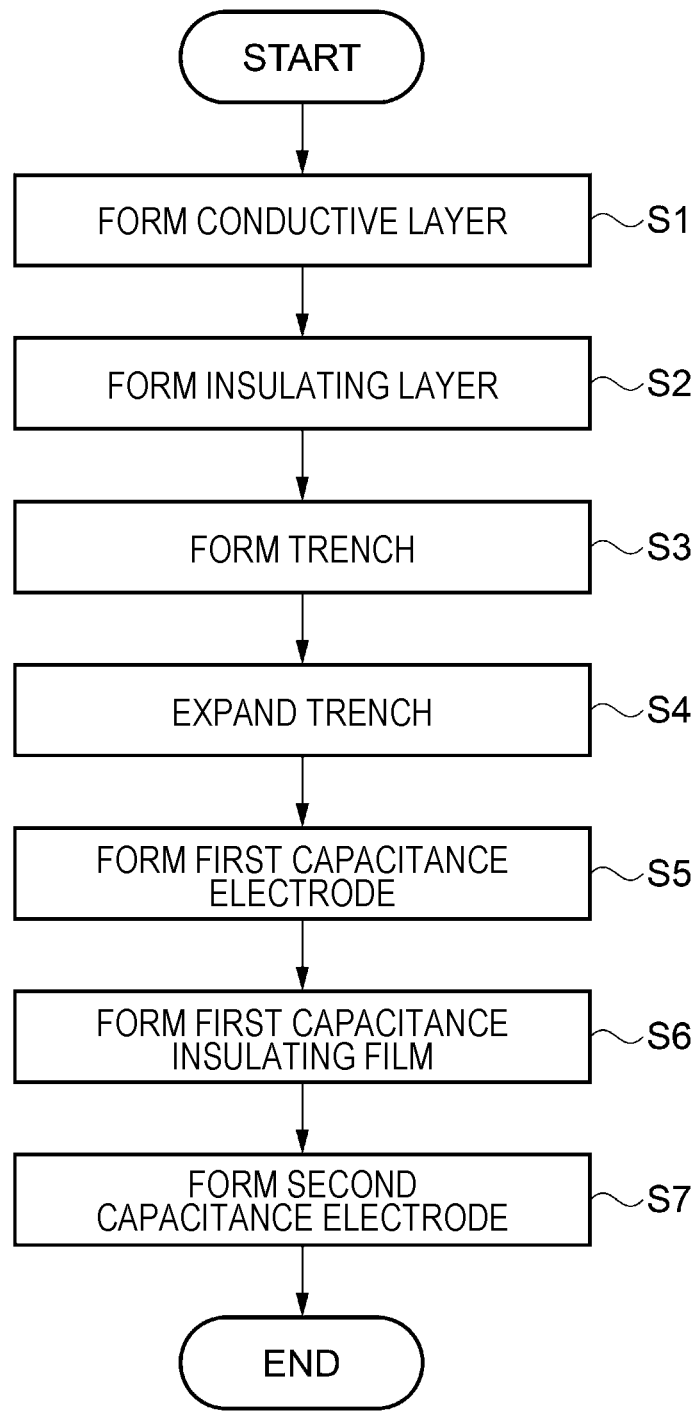
FIG. 8 is a flowchart illustrating a method of manufacturing the liquid crystal device according to a first embodiment.

Next, a method of manufacturing the liquid crystal device 100 will be described as an example of a method of manufacturing the electro-optical device according to the present embodiment. Since a characteristic part of the method of manufacturing the liquid crystal device 100 is in the method of forming the retention capacitor 16, a method of forming the retention capacitor 16 and a configuration relating thereto will be described with reference to FIGS. 8 to 18. FIG. 8 is a flowchart illustrating a method of manufacturing a liquid crystal device, and FIGS. 9 to 18 are views illustrating steps in the method of manufacturing the liquid crystal device. FIGS. 9 to 18 excluding FIG. 13 are schematic cross-sectional views illustrating a structure of the element substrate in the manufacturing steps along the line VI-VI of FIG. 5, and FIG. 13 is a schematic plan view illustrates disposition of the bottle shaped trench with respect to the conductive layer.

As illustrated in FIG. 8, the method of manufacturing the liquid crystal device 100 according to the present embodiment includes a conductive layer forming step (step S1), an insulating layer forming step (step S2), a trench forming step (step S3), a trench extending step (step S4), a first capacitance electrode forming step (step S5), a first capacitance insulating film forming step (step S6), and a second capacitance electrode forming step (step S7).

The step of forming the first light shielding layer 51 and the TFT 30 on the base member 10s, the step of forming the third light shielding layer 53 functioning as the scan line 3, and the like can be performed by applying a known method. In addition, a method of forming the wiring layer 56a functioning as the data line 6, the wiring layer 57a functioning as the capacitance line 7, the pixel electrode 15, and the like after the retention capacitor 16 is formed can also be performed by applying a known method.

Figure 9:
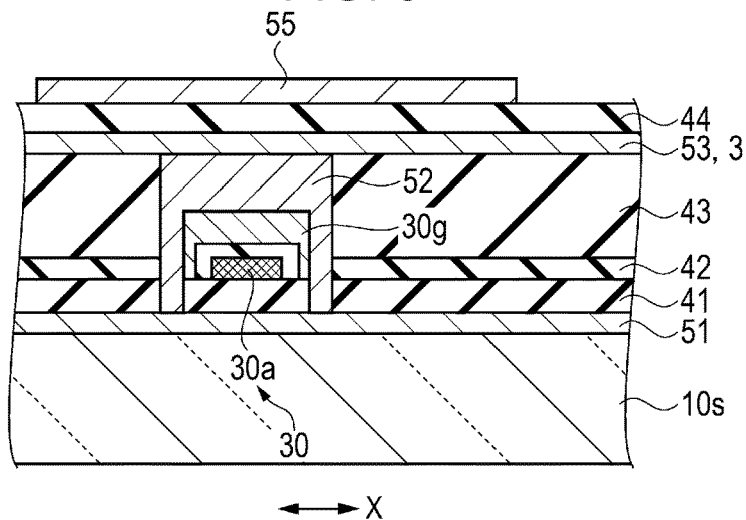
FIG. 9 is a view illustrating steps of the method of manufacturing the liquid crystal device according to the first embodiment.

In the conductive layer forming step of step S1, the conductive layer 55 is formed on the second interlayer insulating film 44 covering the third light shielding layer 53, as illustrated in FIG. 9. While being not illustrated in FIG. 9, the relay layer 55c relating to the contact hole 31 of the first source and drain region 30s and the relay layer 55d relating to the contact hole 32 of the second source and drain region 30d are also formed at the same time (see FIG. 7). As a method of forming the conductive layer 55 and the relay layers 55c and 55d, a conductive film for low resistance wiring which covers the second interlayer insulating film 44 is formed by using, for example, a sputtering method and the like, and the conductive film is patterned by using a photolithography method. Since the first capacitance electrode 16a is formed to come into contact with the conductive layer 55 in a subsequent process, the same material as the first capacitance electrode 16a is used for the conductive film in consideration of mutual electrical stable connection. In the present embodiment, TiN is used as materials of the conductive layer 55 and the first capacitance electrode 16a. A layer thickness of the conductive film is, for example, 100 nm to 150 nm. Then, the processing proceeds to step S2.

Figure 10:
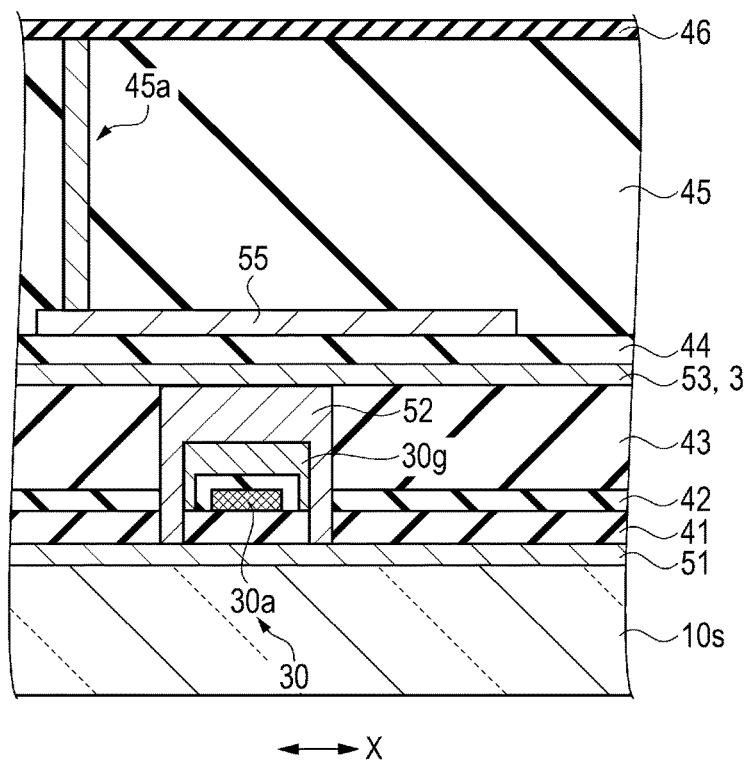
FIG. 10 is a view illustrating steps of the method of manufacturing the liquid crystal device according to the first embodiment.

In the insulating layer forming step of step S2, a first insulating layer 45 as a first layer with insulating properties covering the conductive layer 55 is first formed as illustrated in FIG. 10. As a method of forming the first insulating layer 45, for example, a tetra ethyl ortho silicate (TEOS) film is formed by using a plasma CVD method. After the through hole reaching the conductive layer 55 is formed in the first insulating layer 45 by using, for example, dry etching, a conductive film is formed to fill the through hole. Further, planarization processing such as CMP processing is performed to so as to reduce unevenness on a surface of the first insulating layer 45 on which the conductive film is formed. Thereby, the contact hole 45a connected to the conductive layer 55 is formed. While being not illustrated in FIG. 10, the contact hole 45b connected to the relay layer 55c and the contact hole 45c connected to the relay layer 55d are formed in the first insulating layer 45 in the same manner (see FIG. 7). Then, the second insulating layer 46 as a second layer is formed by being stacked on the planarized first insulating layer 45. As a method of forming the second insulating layer 46, it is possible to use a method of forming a film by using a sputtering method by using, for example, silicon nitride (SiNx), crystalline hafnium oxide (HfOx), zirconium oxide (ZrOx), or the like which has etching resistance with respect to isotropic etching more than the first insulating layer 45 formed by using a TEOS film, in consideration of the formation of the bottle shaped trench which will be performed thereafter. A layer thickness of the second insulating layer 46 is, for example, 50 nm to 150 nm. In contrast to this, a layer thickness of the first insulating layer 45 after the planarization processing is larger than the second insulating layer 46, and is, for example, 3000 nm (3 μm). The second layer having etching resistance with respect to isotropic etching rather than the first insulating layer 45 is not limited to being formed by using an insulating material. For example, the second layer may be formed by using a semiconductor material such as amorphous silicon or depot polysilicon, or a metal compound such as titanium nitride (TiN) or tantalum nitride (TaN). Then, the processing proceeds to step S3.

Figure 11:
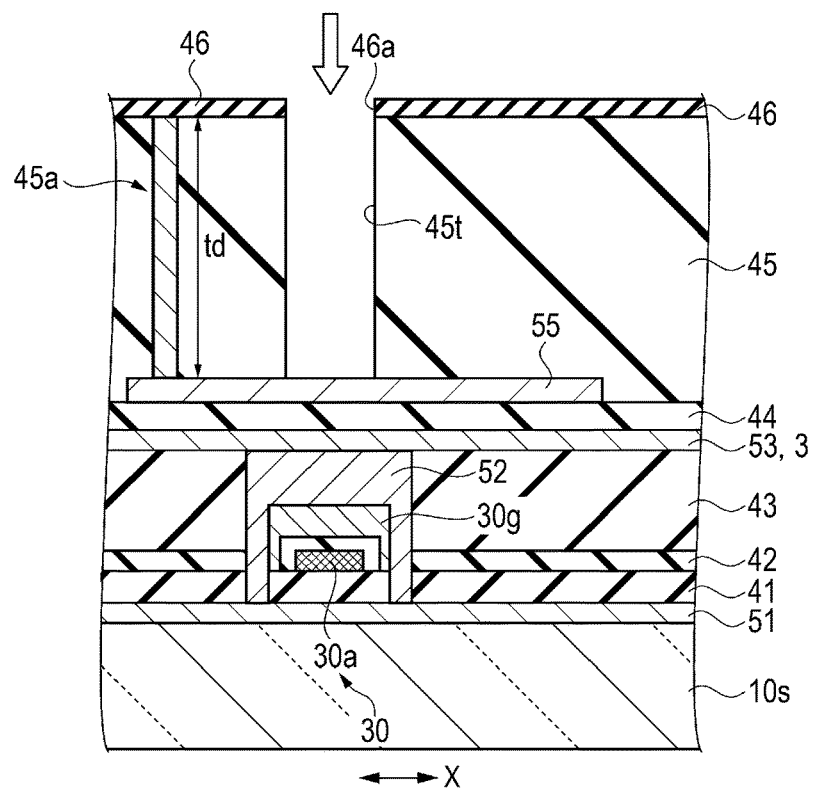
FIG. 11 is a view illustrating steps of the method of manufacturing the liquid crystal device according to the first embodiment.

In the trench forming step of step S3, the trench 45t is formed so as to pass through the second insulating layer 46 and the first insulating layer 45 and reach the conductive layer 55 as illustrated in FIG. 11. A method of performing dry etching which is anisotropic etching from the second insulating layer 46 side can be used as a method of forming the trench 45t. Thereby, the trench 45t whose cross section has a substantially constant width is formed. In the dry etching, the conductive layer 55 functions as an etching stopper. In other words, as the trench 45t is formed by performing the anisotropic etching of the first insulating layer 45 on the conductive layer 55, it is possible to reliably define a depth td of the trench 45t. Then, the processing proceeds to step S4.

Figure 12:
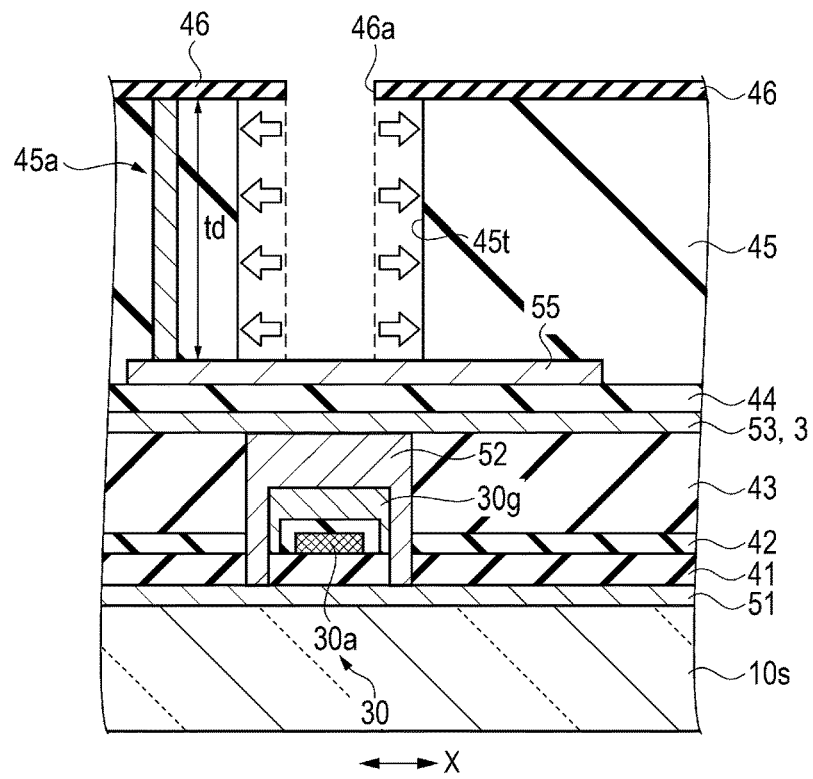
FIG. 12 is a view illustrating steps of the method of manufacturing the liquid crystal device according to the first embodiment.
Figure 13:
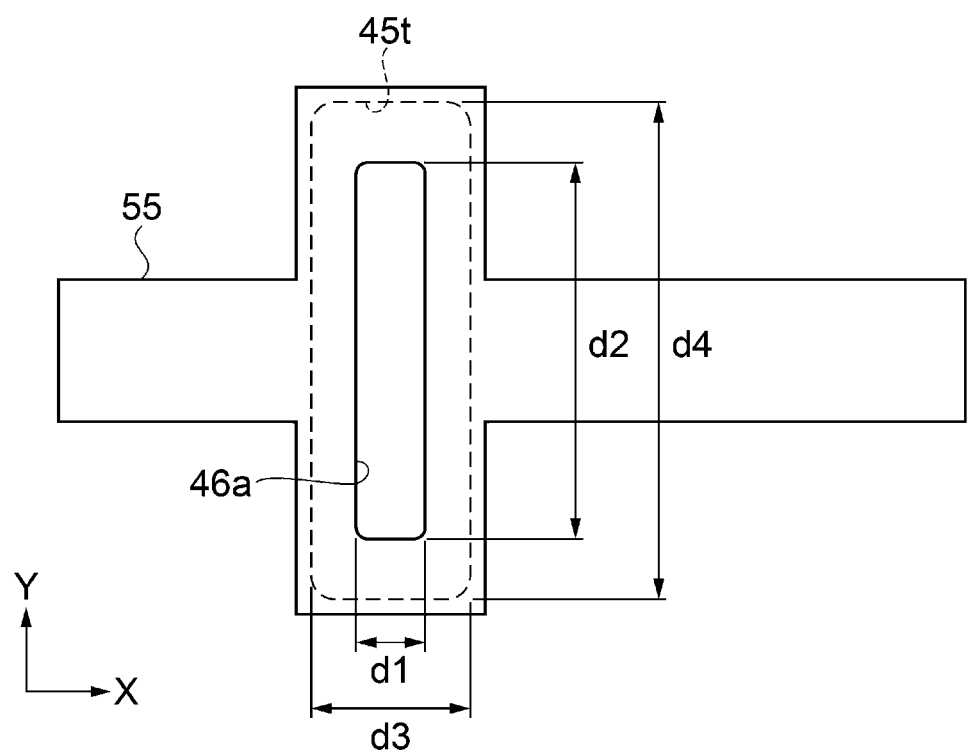
FIG. 13 is a schematic plan view illustrating disposition of a bottle shaped trench with respect to a conductive layer.

In the trench expanding step of step S4, the width of the cross section of the trench 45t in the cross section is expanded within a range not protruding from the conductive layer 55, as illustrated in FIG. 12. As a method of expanding the width of the trench 45t, a method of performing isotropic etching of the first insulating layer 45 configured by the TEOS film exposed in the trench 45t in a width direction by wet etching using a solution containing, for example, hydrofluoric acid. Thereby, as illustrated in FIG. 13, the trench 45t expanded so as not to protrude from a portion of the conductive layer 55 of a substantially cross shape in the Y direction in a planar view is formed. In addition, the aperture 46a defined by the second insulating layer 46 is formed on the inner side of the trench 45t. That is, the bottle shaped trench 45t of a substantially rectangle which is long in the Y direction in a planar view is formed. The shape of the bottle shaped trench 45t in a planar view is not limited to being substantially rectangular. For example, the bottle shaped trench 45t of a substantially cross shape may be formed corresponding to a shape of the substantially cross-shaped conductive layer 55.

In the bottle shaped trench 45t, a width of the aperture 46a in the X direction in a planar view is referred to as d1 and a width in the Y direction is referred to as d2. In addition, a width of the trench 45t in the X direction in a planar view is referred to as d3, and a width in the Y direction is referred to as d4. As illustrated in FIG. 12, a depth of the trench 45t is referred to as td. Since the bottle shaped trench 45t is formed by performing the isotropic etching as described above, the width d3 of the trench 45t in the X direction is larger than the width d1 of the aperture 46a in the X direction, and in the same manner, the width d4 of the trench 45t in the Y direction is larger than the width d2 of the aperture 46a in the Y direction. In addition, a distance between the aperture 46a and an inner wall of the trench 45t in the X direction in a planar view is the same as a distance in the Y direction. That is, a planar shape of the aperture 46a and a planar shape of the trench 45t are similar to each other. Then, the processing proceeds to step S5. The X direction and the Y direction that define the width of the bottle shaped trench 45t are an example of a first direction parallel to the substrate according to the invention.

Figure 14:
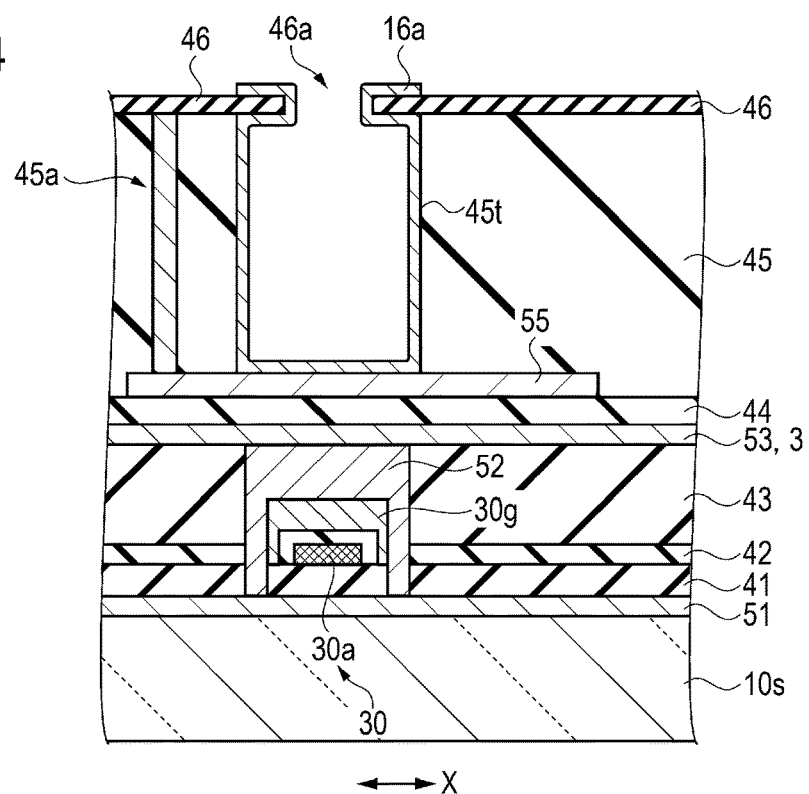
FIG. 14 is a view illustrating steps of the method of manufacturing the liquid crystal device according to the first embodiment.

In the first capacitance electrode forming step of step S5, a first conductive film covering the inner wall of the trench 45t and a surface of the second insulating layer 46 is formed, and the first conductive film is patterned to form the first capacitance electrode 16a as illustrated in FIG. 14. Since the first conductive film is in contact with the conductive layer 55 at the bottom of the trench 45t, as described above, the conductive layer 55 and the first capacitance electrode 16a are formed by using the same material. Specifically, a TiN film as a first conductive film with a film layer thickness of, for example, approximately 50 nm is formed by using a CVD method using gas containing $TiCl_4$ and nitrogen gas. The TiN film is patterned to form the first capacitance electrode 16a. The first capacitance electrode 16a is formed to cover the inside of the trench 45t and to cover a part of a surface of the second insulating layer 46 including the aperture 46a. Then, the processing proceeds to step S6.

Figure 15:
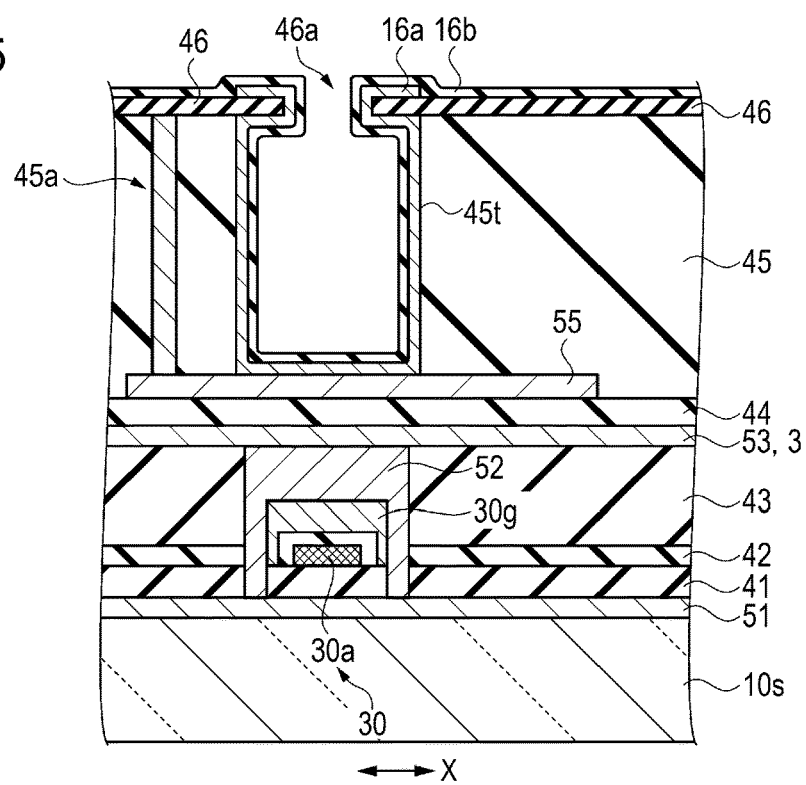
FIG. 15 is a view illustrating steps of the method of manufacturing the liquid crystal device according to the first embodiment.

In the first capacitance insulating film forming step of step S6, the first capacitance insulating film 16b is formed to cover a surface of the first capacitance electrode 16a including the inside of the trench 45t as illustrated in FIG. 15. As a method of forming the first capacitance insulating film 16b, it is also possible to use the CVD method, but it is preferable to use atomic layer deposition (ALD) method by considering that a film can be formed as thin and uniform as possible in consideration of a coverage with respect to the first capacitance electrode 16a formed inside the trench 45t and electric capacitance. In addition, it is preferable to form a high dielectric constant film configured by aluminum oxide ($Al_2O_3$), hafnium oxide ($HfO_2$), zirconium oxide ($ZrO_2$) or the like having a dielectric constant higher than that of silicon oxide by using the ALD method in view of increasing electric capacitance. A layer thickness of the first capacitance insulating film 16b is, for example, 10 nm to 40 nm. Then, the processing proceeds to step S7.

Figure 16:
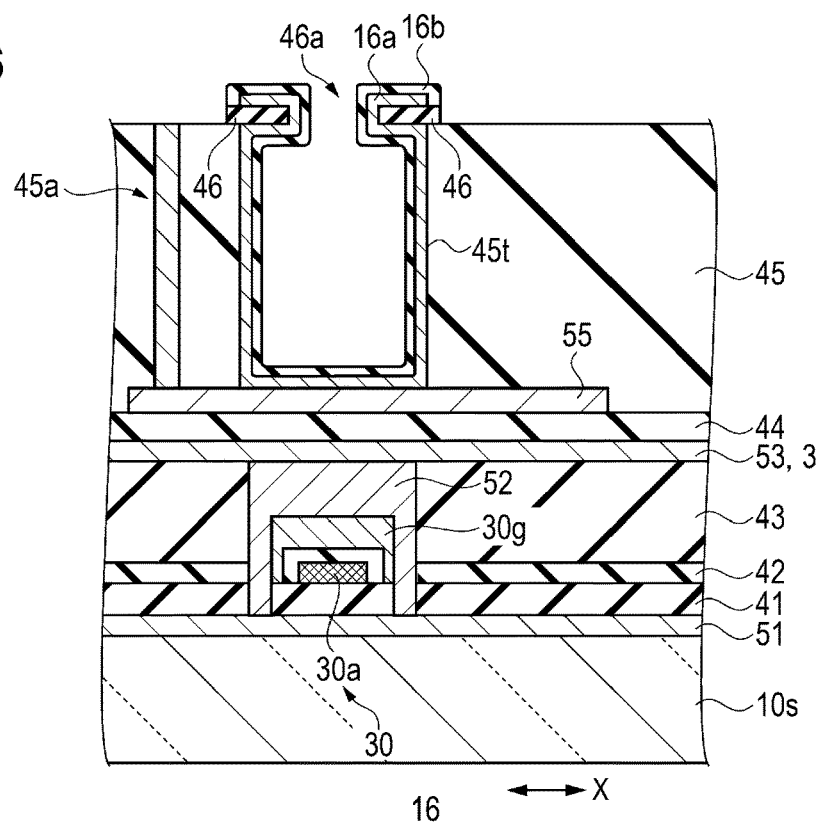
FIG. 16 is a view illustrating steps of the method of manufacturing the liquid crystal device according to the first embodiment.

In the second capacitance electrode forming step of step S7, the second insulating layer 46 and the first capacitance insulating film 16b are first dry-etched to perform collective patterning in a state where the second insulating layer 46 and the first capacitance insulating film 16b around the aperture 46a are left as they are, as illustrated in FIG. 16. Thereby, the contact hole 45a is exposed on a surface of the first insulating layer 45. While being not illustrated in FIG. 16, the contact hole 45b for being electrically connected to the first source and drain region 30s of the semiconductor layer 30a and the contact hole 45c for being electrically connected to the second source and drain region 30d of the semiconductor layer 30a are also exposed on the surface of the first insulating layer 45. In addition, the second insulating layer 46 and the first capacitance insulating film 16b in an aperture region other than the non-aperture region in which the TFT 30 is provided in a planar view are also dry-etched. Thus, the second insulating layer 46 configured by, for example, silicon nitride and the first capacitance insulating film 16b configured by a high dielectric constant film having transmittance lower than that of silicon oxide are removed, and thereby, it is possible to suppress reduction of the transmittance of the aperture region.

Figure 17:
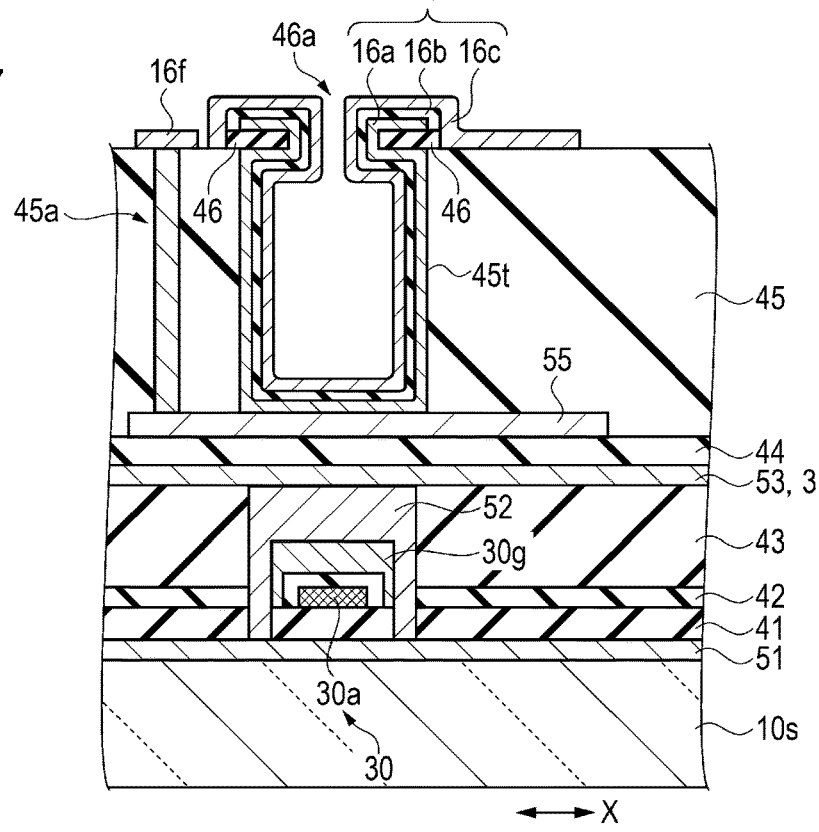
FIG. 17 is a view illustrating steps of the method of manufacturing the liquid crystal device according to the first embodiment.

Then, a second conductive film is formed so as to cover the surface of the first capacitance insulating film 16b including the inside of the trench 45t, and the second conductive film is patterned to form the second capacitance electrode 16c and the relay layer 16f as illustrated in FIG. 17. A method of forming the second conductive film is the same as the method of forming the first capacitance electrode 16a, and a TiN film as a second conductive film with a layer thickness of, for example, approximately 50 nm is formed by using a CVD method using gas containing TiCl$_4$ and nitrogen gas. The relay layer 16f is formed at a location overlapping the contact hole 45a, and the second capacitance electrode 16c is patterned so as to extend to the outside of a region where the bottle shaped trench 45t is formed. While being not illustrated in FIG. 17, the relay layer 16g is formed at a location overlapping the contact hole 45b for being electrically connected to the first source and drain region 30s of the semiconductor layer 30a in the same layer as the second capacitance electrode 16c at the same time. In addition, the second capacitance electrode 16c is also patterned so as to overlap the contact hole 45c for being electrically connected to the second source and drain region 30d of the semiconductor layer 30a (see FIG. 7). Thereby, the retention capacitor 16 whose cross-section has a bottle shape is formed in which the first capacitance electrode 16a, the first capacitance insulating film 16b, and the second capacitance electrode 16c are sequentially stacked, in the trench 45t on the conductive layer 55.

Figure 18:
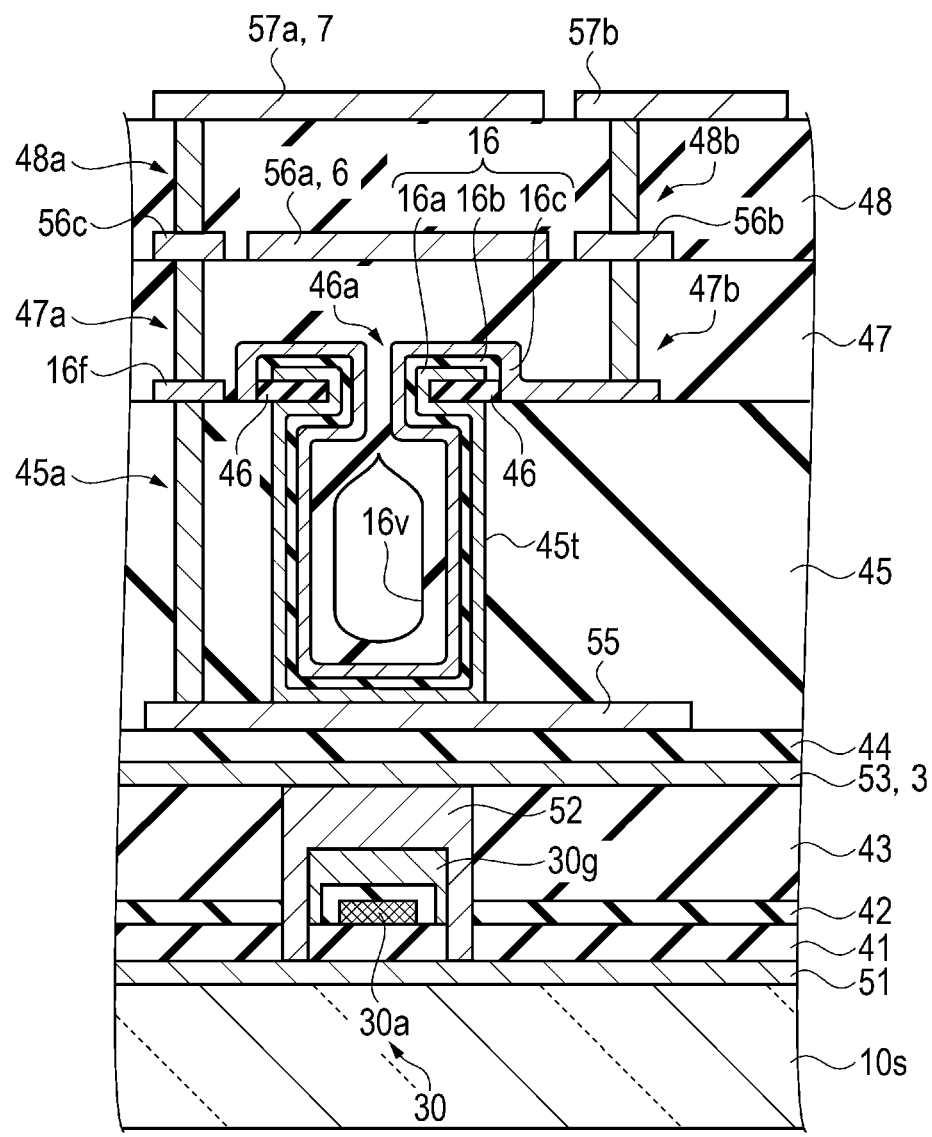
FIG. 18 is a view illustrating steps of the method of manufacturing the liquid crystal device according to the first embodiment.

Thereafter, as illustrated in FIG. 18, the third interlayer insulating film 47 covering the retention capacitor 16 is formed. The wiring layer 56a functioning as the data line 6 is formed on the third interlayer insulating film 47, and the relay layer 56b connected to the second capacitance electrode 16c through the contact hole 47b and the relay layer 56c connected to the relay layer 16f through the contact hole 47a. Then, the fourth interlayer insulating film 48 covering the wiring layer 56a and the relay layers 56b and 56c is formed. In addition, the wiring layer 57a functioning as the capacitance line 7 connected to the relay layer 56c through the contact hole 48a, and the relay layer 57b connected to the relay layer 56b through the contact hole 48b are formed on the fourth interlayer insulating film 48.

Accordingly, the first capacitance electrode 16a of the retention capacitor 16 is connected to the wiring layer 57a, that is, the capacitance line 7 through the conductive layer 55, the contact hole 45a, the relay layer 16f, the contact hole 47a, the relay layer 56c, and the contact hole 48a. Meanwhile, the second capacitance electrode 16c of the retention capacitor 16 is connected to the pixel electrode 15 through the contact hole 47b, the relay layer 56b, the contact hole 48b, the relay layer 57b, and the contact hole 49a (see FIG. 6). In addition, the second capacitance electrode 16c is connected to the second source and drain region 30d of the semiconductor layer 30a, that is, the drain of the TFT 30 through the contact hole 45c, the relay layer 55d, and the contact hole 32 (see FIG. 7).

Since the liquid crystal device 100 is used as light modulating means (liquid crystal light valve) as described above, widths of the non-aperture region where the retention capacitor 16 in the X direction and the Y direction are set to 1 μm or more and to be less than 1.5 for example, when a pitch of the pixel P is less than 5 By doing so, the width d1 of the aperture 46a in the X direction has a submicron unit, and thus, if the depth td of the bottle shaped trench 45t is too large, it is difficult to uniformly form the first capacitance electrode 16a and the second capacitance electrode 16c inside the trench 45t by using a CVD method. From a viewpoint of uniformly forming the first capacitance electrode 16a, the first capacitance insulating film 16b, and the second capacitance electrode 16c inside the bottle shaped trench 45t in the method of manufacturing the liquid crystal device 100 (method of forming the retention capacitor 16), an aspect ratio (d2/d4) of the width d2 of the aperture 46a in the Y direction with respect to the width d4 of the bottle shaped trench 45t in the Y direction is preferably 0.89 to 0.96, and an aspect ratio (td/d2) of the depth td of the trench 45t with respect to the width d2 of the trench 45t in the aperture 46a in the Y direction is preferably 0.11 to 1.15. As the depth of the trench 45t increases, it is necessary to increase a size of the aperture 46a, but, from a viewpoint of realizing a desired electric capacitance in the retention capacitor 16, it is preferable to appropriately adjust the size within a range of the aspect ratio.

According to the liquid crystal device 100 of the first embodiment and the manufacturing method thereof, the following effects can be obtained.

(1) Compared with a case where the retention capacitor 16 is formed in the trench 45t formed by performing anisotropic etching of the first insulating layer 45 and the second insulating layer 46 which are stacked, the retention capacitor 16 is formed in the trench 45t whose width is expanded by performing isotropic etching of the first insulating layer 45, and thereby, the cross section of the retention capacitor 16 has a bottle shape. Thus, the first capacitance electrode 16a, the first capacitance insulating film 16b, and the second capacitance electrode 16c are also formed on the surface of the second insulating layer 46 protruding like an eave on an inner side of the bottle shaped trench 45t, and thereby, an area of the capacitance electrode facing each other with the first capacitance insulating film 16b interposed therebetween is increased. That is, it is possible to provide or manufacture the liquid crystal device 100 including the retention capacitor 16 having a larger electric capacitance than the retention capacitor of related art.

(2) The trench 45t is formed on the conductive layer 55 and is formed such that the conductive layer 55 and the first capacitance electrode 16a are in contact with each other at the bottom of the trench 45t. Thus, the conductive layer 55 can be used as a wire for electrically connecting the conductive layer 55 to the first capacitance electrode 16a, and thereby, a wiring structure relating to the retention capacitor 16 can be simplified. In addition, when the trench 45t is formed by performing anisotropic etching to the first insulating layer 45, the conductive layer 55 functions as an etching stopper, and thereby, the depth td of the trench 45t can be reliably defined. In other words, the retention capacitor 16 having a desired electric capacitance can be easily formed.

(3) Since the first capacitance insulating film 16b is formed by using the high dielectric constant film, it is possible to increase the electric capacitance of the retention capacitor 16 as compared with a case where the first capacitance insulating film 16b is formed by using silicon oxide.

(4) In the element substrate 10, the bottle shaped trench 45t is formed so as to overlap the semiconductor layer 30a of the TFT 30 in a planar view, and the retention capacitor 16 is formed in the bottle shaped trench 45t. Since a conductive film with a light shielding property (TiN film) is used for the first capacitance electrode 16a and the second capacitance electrode 16c which configure the retention capacitor 16, the light incident on the semiconductor layer 30a of the element substrate 10 from the counter substrate 20 side can be shielded by the retention capacitor 16. Thus, it is possible to provide or manufacture the liquid crystal device 100 including the TFT 30 that suppresses generation of a light leakage current flowing through the semiconductor layer 30a and can obtain a stable operation for each pixel P.

Second Embodiment

Figure 19:
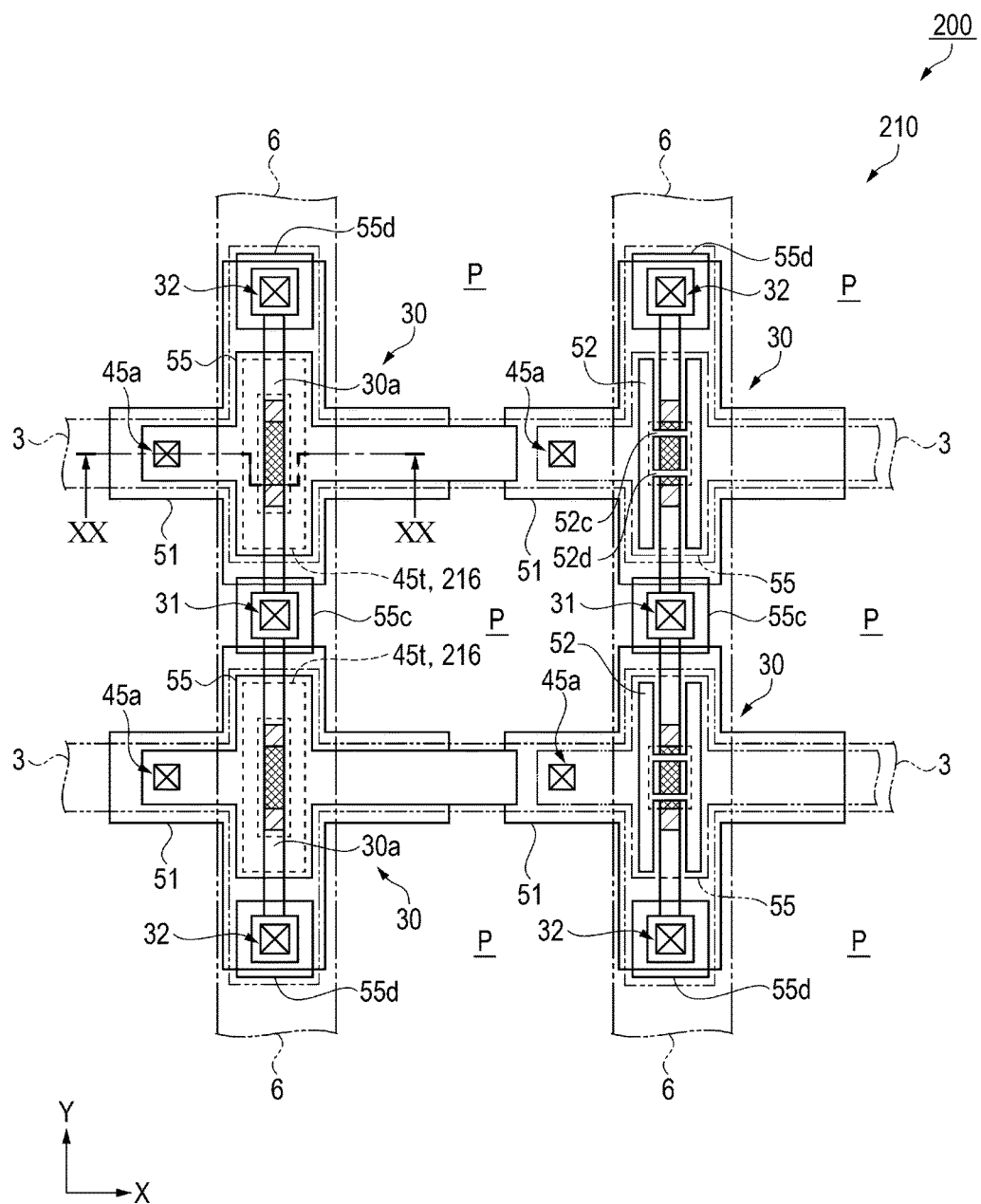
FIG. 19 is a schematic plan view illustrating arrangement of TFTs and retention capacitors in an element substrate of a liquid crystal device according to a second embodiment.
Figure 20:
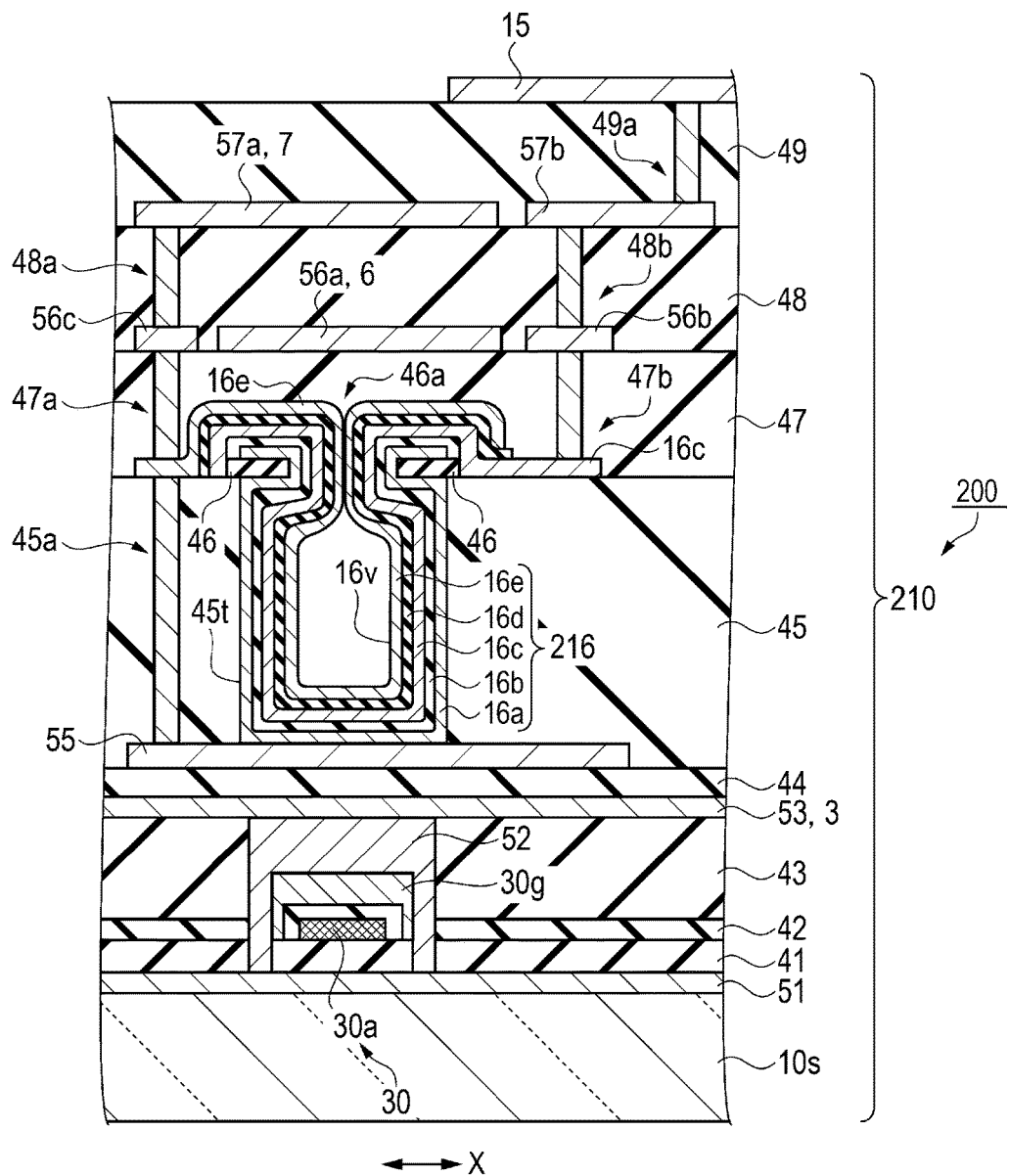
FIG. 20 is a schematic cross-sectional view illustrating a structure of the element substrate taken along a line XX-XX of FIG. 19.

Next, a liquid crystal device according to the second embodiment will be described with reference to FIGS. 19 and 20. FIG. 19 is a schematic plan view illustrating arrangement of TFTs and retention capacitors in an element substrate of the liquid crystal device according to the second embodiment, and FIG. 20 is a schematic cross-sectional view illustrating a structure of the element substrate taken along a line XX-XX of FIG. 19.

A liquid crystal device 200 according to the second embodiment is different from the liquid crystal device 100 according to the first embodiment in configuration of the retention capacitor 16. Thus, the same reference numerals or symbols are attached to the same configuration as those of the liquid crystal device 100 according to the first embodiment, and a detailed description thereof will be omitted.

As illustrated in FIG. 19, the liquid crystal device 200 according to the present embodiment includes an element substrate 210 having the TFTs 30 and retention capacitors 216 which are provided for each pixel P. The other configurations are the same as the configurations of the liquid crystal device 100 according to the first embodiment. In the element substrate 210, the TFT 30 is provided corresponding to an intersection between the scan line 3 and the data line 6. The semiconductor layer 30a of the TFT 30 has an LDD structure. In the adjacent pixels P in the Y direction, the first source and drain regions of the two semiconductor layers 30a are connected to each other so as to share the contact hole 31, and the two semiconductor layer 30a are arranged along the data line 6.

The liquid crystal device 200 according to the present embodiment includes a substantially cross-shaped conductive layer 55 disposed so as to overlap the semiconductor layer 30a at the intersection. The retention capacitor 216 is formed in the bottle shaped trench 45t provided on the conductive layer 55. A plan shape of the bottle shaped trench 45t is also a substantially rectangular shape which is long in the Y direction.

Line XX-XX of FIG. 19 is a line segment passing through the contact hole 45a on the conductive layer 55, and a boundary between a channel region and a junction region of the semiconductor layer 30a in the X direction in a planar view in the same manner as line VI-VI of FIG. 5.

As illustrated in FIG. 20, the bottle shaped trench 45t is formed in the first insulating layer 45 and the second insulating layer 46 on the conductive layer 55. A layer thickness of the first insulating layer 45 is larger than a layer thickness of the second insulating layer 46. The retention capacitor 216 is configured by includes the first capacitance electrode 16a, the first capacitance insulating film 16b, the second capacitance electrode 16c, a second capacitance insulating film 16d, and a third capacitance electrode 16e which are sequentially stacked by including an inner side of the bottle shaped trench 45t. That is, the retention capacitor 216 is configured by adding the second capacitance insulating film 16d and the third capacitance electrode 16e to the retention capacitor 16 in the liquid crystal device 100 according to the first embodiment.

The first capacitance electrode 16a is in contact with the conductive layer 55 at the bottom of the bottle shaped trench 45t. The second capacitance electrode 16c is provided so as to be in contact with the contact hole 47b provided in the third interlayer insulating film 47. The third capacitance electrode 16e is provided so as to be in contact with the contact hole 45a provided in the first insulating layer 45. Thus, the first capacitance electrode 16a and the third capacitance electrode 16e are electrically connected to each other through the contact hole 45a and the conductive layer 55. The third capacitance electrode 16e is electrically connected to the wiring layer 57a functioning as the capacitance line 7 through the contact hole 47a provided in the third interlayer insulating film 47, the relay layer 56c, and the contact hole 48a provided in the fourth interlayer insulating film 48. The second capacitance electrode 16c is electrically connected to the pixel electrode 15 through the contact hole 47b provided in the third interlayer insulating film 47, the relay layer 56b, the contact hole 48b provided in the fourth interlayer insulation film 48, the relay layer 57b, and the contact hole 49a provided in the fifth interlayer insulating film 49. In addition, while being not illustrated in FIG. 20, the second capacitance electrode 16c is electrically connected to the second source and drain region of the semiconductor layer 30a of the TFT 30 through the relay layer 55d and the contact hole 32 (see FIG. 19).

That is, the retention capacitor 216 has a configuration in which a first capacitor element including the first capacitance electrode 16a, the first capacitance insulating film 16b, and the second capacitance electrode 16c is connected in parallel to a second capacitance electrode including the second capacitance electrode 16c, the second capacitance insulating film 16d, and the third capacitance electrode 16e, between the drain of the TFT 30 and the capacitance line 7.

A method of manufacturing the liquid crystal device 200 further includes a step of forming the second capacitance insulating film 16d covering the second capacitance electrode 16c and a step of forming the third conductive film covering the second capacitance insulating film 16d and forming the third capacitance electrode 16e by patterning the third conductive film, in addition to the steps S1 to S7 in the method of manufacturing the liquid crystal device 100 according to the first embodiment.

It is more preferable to use a method of forming the second capacitance insulating film 16d in that the electric capacitance is increased by forming the high dielectric constant film configured by aluminum oxide ($Al_2O_3$), hafnium oxide ($HfO_2$), zirconium oxide ($ZrO_2$) or the like having a dielectric constant higher than silicon oxide by using an ALD method, in the same manner as the first capacitance insulating film 16b in the retention capacitor 16 according to the first embodiment. A layer thickness of the second capacitance insulating film 16d is, for example, 10 nm to 40 nm. The first capacitance insulating film 16b and the second capacitance insulating film 16d are not limited to being formed of the same high dielectric constant film, and may be formed of a high dielectric constant film by using different types of materials. In addition, any one of the first capacitance insulating film 16b and the second capacitance insulating film 16d may be formed by using a high dielectric constant film.

In a method of forming the third capacitance electrode 16e, a TiN film as a third conductive film with a film layer thickness of, for example, approximately 50 nm is formed by using a CVD method which uses gas containing $TiCl_4$ and nitrogen gas, in the same manner as the first capacitance electrode 16a in the retention capacitor 16 according to the first embodiment. It depends on sizes of the bottle shaped trench 45t and the aperture 46a, but in the step of forming the third conductive film (TiN film), the aperture 46a is covered by the third conductive film and a void 16v may occur inside the bottle shaped trench 45t.

According to the liquid crystal device 200 according to the second embodiment and the manufacturing method thereof, the retention capacitor 216 in which the first capacitance element and the second capacitance element are connected in parallel to the bottle shaped trench 45t on the conductive layer 55 is formed, and thereby, it is possible to provide or manufacture the liquid crystal device 200 including the retention capacitor 216 having a larger electric capacitance than the retention capacitor 16 of the liquid crystal device 100 according to the first embodiment. In other words, as compared with the first embodiment, the retention capacitor 216 having a desired electric capacitance can be easily realized, even if a non-aperture region in which the bottle shaped trench 45t can be disposed is narrowed.

Third Embodiment

Electronic Apparatus

Figure 21:
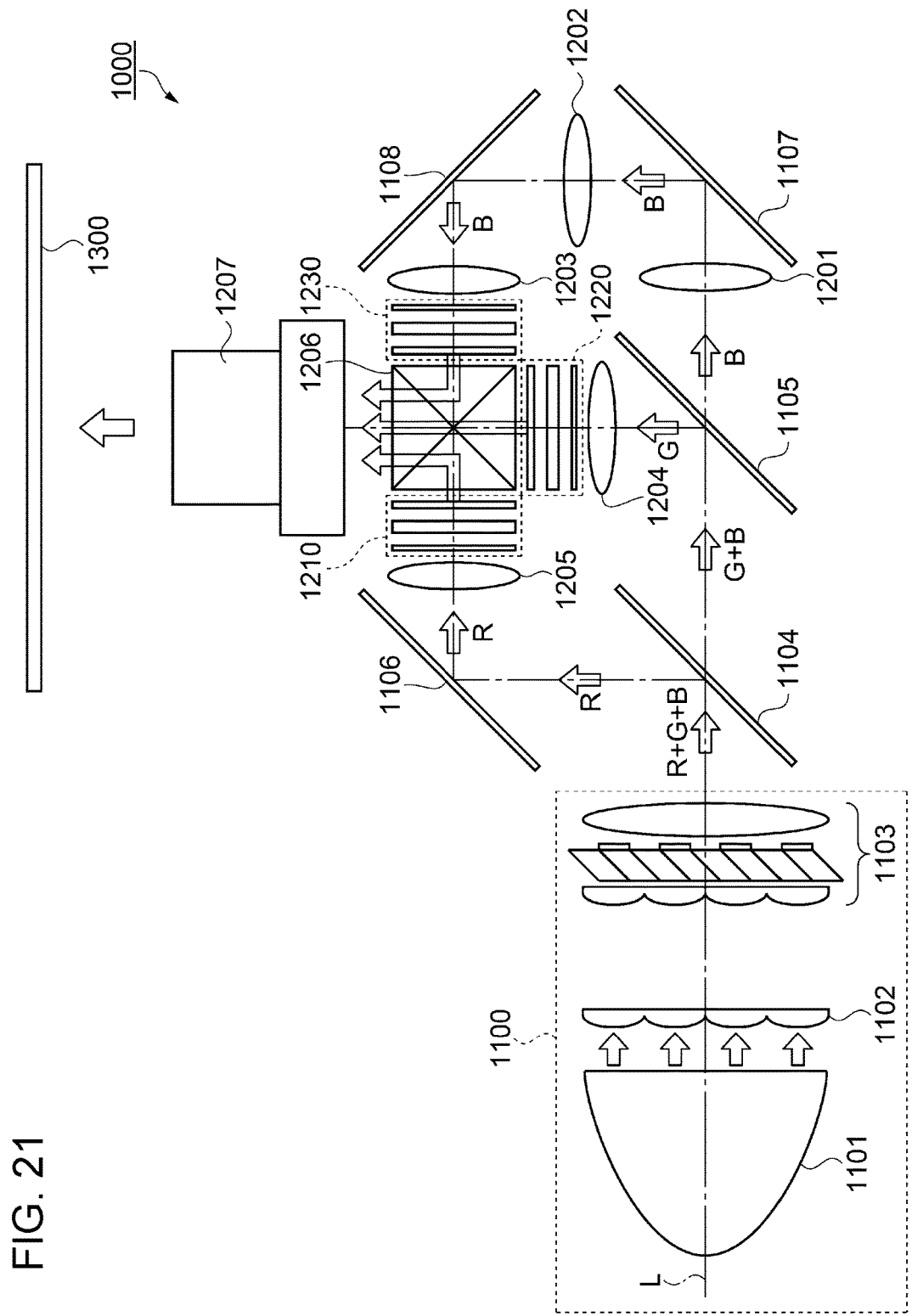
FIG. 21 is a schematic view illustrating a configuration of a projection type display device as an electronic apparatus.

Next, a projection type display device will be described as an example with reference to FIG. 21 as an electronic apparatus to which the liquid crystal device according to each of the above-described embodiments is applied. FIG. 21 is a schematic view illustrating a configuration of the projection type display device as the electronic apparatus.

As illustrated in FIG. 21, the projection type display device 1000 that is used as an electronic apparatus according to the present embodiment includes a polarized light illumination device 1100 disposed along a system optical axis L and two dichroic mirrors 1104 and 1105 that is used as light separating elements. In addition, three reflection mirrors 1106, 1107, and 1108, and five relay lenses 1201, 1202, 1203, 1204, and 1205 are included in the projection type display device. Furthermore, transmission type liquid crystal light valves 1210, 1220, and 1230 that are used as three optical modulation units, a cross dichroic prism 1206 that is used as a photosynthesis element, and a projection lens 1207 are included in the projection type display device.

A The polarized light illumination device 1100 is schematically configured by, for example, a lamp unit 1101 that is used as a light source configured with a white light source such as an ultrahigh pressure mercury lamp or halogen lamp, an integrator lens 1102, and a polarized light conversion element 1103.

The dichroic mirror 1104 reflects red light (R) and makes green light (G) and blue light (B) pass through, among polarized light flux that is emitted from the polarized light illumination device 1100. The other dichroic mirror 1105 reflects the green light (G) that passes through the dichroic mirror 1104, and makes the blue light (B) pass through.

The red light (R) that is reflected by the dichroic mirror 1104 is reflected by the reflection mirror 1106, and thereafter, is incident on the liquid crystal light valve 1210 through the relay lens 1205.

The green light (G) that is reflected by the dichroic mirror 1105 is incident on the liquid crystal light valve 1220 through the relay lens 1204.

The blue light (B) that passes through the dichroic mirror 1105 is incident on the liquid crystal light valve 1230 through a light guide system configured with the three relay lenses 1201, 1202, and 1203, and the two reflection mirrors 1107 and 1108.

The liquid crystal light valves 1210, 1220, and 1230 are respectively disposed to face the incident surfaces of each color light of the cross dichroic prism 1206. The colored light incident on the liquid crystal light valves 1210, 1220, and 1230 is modulated based on video information (video signal) and is emitted toward the cross dichroic prism 1206. The prism is configured with four rectangular prisms bonded to each other, and a dielectric multilayer that reflects red light and a dielectric multilayer that reflects blue light are formed in a cross shape in the inner surface of the prism. Three colored lights are synthesized by the dielectric multilayers, and lights that represent color images are synthesized. The synthesized light is projected onto a screen 1300 by the projection lens 1207 that is a projection optical system, and an image is enlarged to be displayed.

The liquid crystal light valve 1210 is a device in which the liquid crystal device 100 (refer to FIG. 1) according to the first embodiment is employed. A pair of polarization elements disposed in the cross Nicol are disposed with a gap on the incident side and the emission side of the color light of the liquid crystal device 100. The other liquid crystal light valves 1220 and 1230 are the same as the liquid crystal light valve 1210.

According to the projection type display device 1000, the liquid crystal device 100 according to the first embodiment is used as the liquid crystal light valves 1210, 1220, and 1230, and thus, the pixel P includes the retention capacitor 16 having a desired electric capacitance, and it is possible to provide the projection type display device 1000 capable of suppressing occurrence of display defects such as crosstalk and flicker and projecting a bright display. Even if the liquid crystal device 200 according to the second embodiment is employed as the liquid crystal light valves 1210, 1220, and 1230, the same effects are obtained.

The invention is not limited to the above-described embodiments, and can be appropriately changed within a range without departing from the gist or idea of the invention which is read from the claims and the entire specification, and an electro-optical device according to the change, a method of manufacturing the electro-optical device, and an electronic apparatus to which the electro-optical device is applied are also included in the technical scope of the invention. Various modification examples in addition to the above-described embodiments are conceivable. Hereinafter, the modification examples will be described.

Modification Example 1

Figure 22:
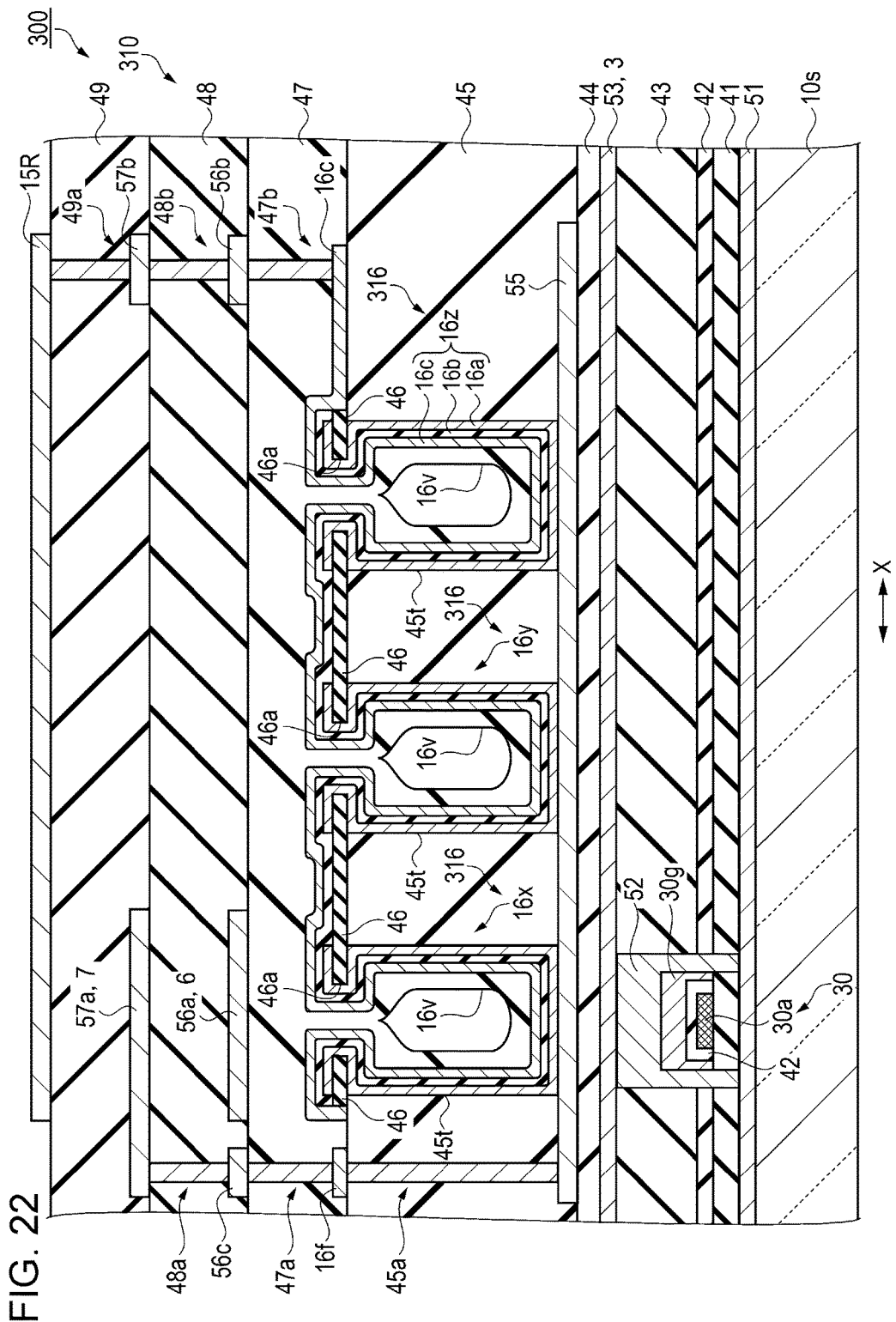
FIG. 22 is a schematic sectional view illustrating a configuration of a retention capacitor in a reflection type liquid crystal device.

The liquid crystal device to which the retention capacitor 16 can be applied is not limited to the transmission type liquid crystal device 100. FIG. 22 is a schematic sectional view illustrating a configuration of a retention capacitor in a reflection type liquid crystal device. For example, as illustrated in FIG. 22, a reflection type liquid crystal device 300 includes an element substrate 310 having a pixel electrode 15R with light reflectivity, a TFT 30, and retention capacitors 316 for each pixel P. The other configurations are the same as configurations in, for example, the liquid crystal device 100. The same configurations as those in the liquid crystal device 100 are denoted by the same reference numerals or symbols, and a detailed description thereof will be omitted. Since the pixel electrode 15R in the liquid crystal device 300 according to a modified example has light reflectivity, arrangement of the TFT 30 on the base member 10s, the scan line 3 electrically connected to the TFT 30, the data line 6, the capacitance line 7, and the retention capacitors 316 is less restrictive than the transmission type liquid crystal device 100. Thus, the retention capacitor 316 is configured by forming, for example, a plurality (three in the present modification example) of bottle shaped trenches 45t in the first insulating layer 45 under the pixel electrode 15R, and forming the first capacitance electrode 16a, the first capacitance insulating film 16b, and the second capacitance electrode 16c so as to cover the inside of each of the bottle shaped trenches 45t and to cover a peripheral portion of the aperture 46a. The first capacitance electrode 16a covers an inner wall of each of the bottle shaped trenches 45t and is electrically connected to the wiring layer 57a functioning as the capacitance line 7 through the conductive layer 55. The second capacitance electrode 16c is formed over the plurality (three) of bottle shaped trenches 45t and is connected to the pixel electrode 15R through the contact hole 47b, the relay layer 56b, the contact hole 48b, the relay layer 57b, and the contact hole 49a. While being not illustrated in FIG. 22, the second capacitance electrode 16c is also electrically connected to the second source and drain region of the TFT 30.

According to modification example 1, it is possible to provide or manufacture the reflection type liquid crystal device 300 including the retention capacitor 316 having a first capacitance element 16x, a second capacitance element 16y, and a third capacitance element 16z between a drain of the TFT 30 and the capacitance line 7 for each pixel P, each capacitance element having the first capacitance electrode 16a, the first capacitance insulating film 16b, and the second capacitance electrode 16c which are sequentially stacked. In other words, even if the reflection type pixel P has high definition and a region where the retention capacitor 316 is provided is restricted, it is possible to realize the retention capacitor 316 having a desired electric capacitance. The configuration of the retention capacitor 216 in the liquid crystal device 200 according to the second embodiment can also be applied to each capacitance element of the retention capacitor 316 in the reflection type liquid crystal device 300 according to the modification example.

Modification Example 2

A sectional shape of the bottle shaped trench 45t in which the retention capacitor according to each embodiment described above is provided is not limited to having a constant width in a layer thickness direction (depth direction) of the first insulating layer 45. If multiple stages of conductive layers, for example, a plurality of conductive layers functioning as etching stoppers are provided, the bottle shaped trench can be formed to have inner walls of multiple stages. According to the configuration, it is possible to provide a bottle shaped retention capacitor corresponding to a wiring structure on the substrate.

Modification Example 3

An electro-optical device to which the retention capacitor according to each embodiment described above is applied is not limited to the transmission type liquid crystal devices 100 and 200 and the reflection type liquid crystal device 300. For example, the electro-optical device may be applied to an organic EL device having a light emitting element such as an organic EL element for each pixel.

Modification Example 4

An electronic apparatus to which the liquid crystal device according to each of the above-described embodiments is applied are not limited to the projection type display device 1000 according to the third embodiment. For example, the counter substrate 20 of the liquid crystal device 100 may have color filters corresponding to at least red (R), green (G), and blue (B), and a projection display device may have a single plate configuration. In addition, the liquid crystal device according to each of the above-described embodiments can be suitably used as a display portion of an information terminal apparatus such as a projection type head up display (HUD), a head mounted display (HMD), an electronic book, a personal computer, a digital still camera, a liquid crystal television, a view finder type or monitor direct view type video recorder, a car navigation system, an electronic diary, a POS, or the like.

The entire disclosure of Japanese Patent Application No. 2017-004880, filed Jan. 16, 2017 is expressly incorporated by reference herein.

What is claimed is:
1. An electro-optical device comprising:
a substrate;
a first layer with an insulating property that is stacked on the substrate;
a trench that is provided in the first layer for each pixel;
a second layer which is stacked on the first layer and is disposed on a top surface of the first layer, the second layer connecting with the trench and having an aperture; and
a capacitance element that includes a first capacitance electrode, a first capacitance insulating film, and a second capacitance electrode which are provided on at least an inner side of the trench and the aperture,
wherein a width of the trench is larger than a width of the aperture in direction parallel to the substrate; and
a portion of the second capacitance electrode is formed on an outer side of the second layer, the outer side of the second layer being a side that opposes an inside of the second layer in a direction parallel to the substrate.

2. The electro-optical device according to claim 1, wherein a conductive layer in contact with the first capacitance electrode is provided between the substrate and the first layer.

3. The electro-optical device according to claim 1, wherein the capacitance element includes the first capacitance electrode, the first capacitance insulating film, the second capacitance electrode, the second capacitance insulating film, and a third capacitance electrode which are provided on at least an inner side of the trench and the aperture.

4. The electro-optical device according to claim 3, wherein at least one of the first capacitance insulating film and the second capacitance insulating film is a high dielectric constant film.

5. The electro-optical device according to claim 1,
wherein a transistor that is provided for each pixel is provided between the substrate and the capacitance element, and
wherein the trench overlaps a semiconductor layer of the transistor in a planar view.

6. An electronic apparatus comprising:
the electro-optical device according to claim 1.

7. An electronic apparatus comprising:
the electro-optical device according to claim 2.

8. An electronic apparatus comprising:
the electro-optical device according to claim 3.

9. An electronic apparatus comprising:
the electro-optical device according to claim 4.

10. An electronic apparatus comprising:
the electro-optical device according to claim 5.

* * * * *